United States Patent
Kim et al.

(10) Patent No.: US 10,924,151 B2
(45) Date of Patent: Feb. 16, 2021

(54) TRANSMITTER DEVICE AND TRANSCEIVER DEVICE FOR TRANSMITTING DIFFERENT WIRELESS STANDARD SIGNAL

(71) Applicant: SAMSUNG ELECTRONICS CO., LTD., Suwon-si (KR)

(72) Inventors: Taewan Kim, Yongin-si (KR); Chia-Hsin Wu, Seongnam-si (KR); Qing Liu, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 0 days.

(21) Appl. No.: 17/002,146

(22) Filed: Aug. 25, 2020

(65) Prior Publication Data

US 2020/0389202 A1 Dec. 10, 2020

Related U.S. Application Data

(63) Continuation of application No. 15/988,147, filed on May 24, 2018, now Pat. No. 10,778,276.

(30) Foreign Application Priority Data

Sep. 18, 2017 (KR) .................. 10-2017-0119720

(51) Int. Cl.
*H04B 1/40* (2015.01)
*H04B 1/04* (2006.01)
(Continued)

(52) U.S. Cl.
CPC .............. *H04B 1/40* (2013.01); *H03F 1/565* (2013.01); *H03F 3/245* (2013.01); *H03F 3/45475* (2013.01); *H03F 3/72* (2013.01); *H04B 1/04* (2013.01); *H04B 1/3805* (2013.01); *H04W 88/06* (2013.01); *H03F 2200/09* (2013.01);
(Continued)

(58) Field of Classification Search
CPC ... H03H 7/38; H04B 1/04; H04B 1/40; H04B 2001/0408; H04W 88/06
See application file for complete search history.

(56) References Cited

U.S. PATENT DOCUMENTS 7,283,840 B2 10/2007 Cho
8,600,300 B2 12/2013 Lee et al.
(Continued)

FOREIGN PATENT DOCUMENTS

JP H6-188622 7/1994

*Primary Examiner* — David Bilodeau
(74) *Attorney, Agent, or Firm* — F. Chau & Associates, LLC

(57) ABSTRACT

A transmitter device which transmits a first transmit signal and a second transmit signal having different wireless communication standards. The transmitter device includes a power amplifier that amplifies the first transmit signal in a first transmission mode. A first impedance circuit provides the amplified first transmit signal to a radio frequency output port. A second impedance circuit is connected to the first impedance circuit and provides an additional impedance to the first impedance circuit in the first transmission mode. A first switch provides the second transmit signal to the first impedance circuit in a second transmission mode. A second switch connects the second impedance circuit and a ground in the first transmission mode, and floats the second impedance circuit in the second transmission mode.

20 Claims, 20 Drawing Sheets

(51) Int. Cl.
    *H04W 88/06*     (2009.01)
    *H03H 7/38*     (2006.01)
    *H03F 1/56*     (2006.01)
    *H03F 3/72*     (2006.01)
    *H03F 3/45*     (2006.01)
    *H04B 1/3805*     (2015.01)
    *H03F 3/24*     (2006.01)

(52) U.S. Cl.
    CPC ............... *H03F 2200/451* (2013.01); *H03F 2203/45731* (2013.01); *H03F 2203/7236* (2013.01); *H03F 2203/7239* (2013.01); *H03H 7/38* (2013.01); *H04B 2001/0408* (2013.01)

(56) References Cited

U.S. PATENT DOCUMENTS

| | | |
|---|---|---|
| 8,923,780 B2 | 12/2014 | Ojo et al. |
| 9,100,079 B2 | 8/2015 | Wu et al. |
| 9,374,122 B2 | 6/2016 | Lee et al. |
| 9,543,900 B1 | 1/2017 | Lin et al. |
| 9,572,176 B2 | 2/2017 | Desai et al. |
| 2011/0298559 A1 | 12/2011 | Kitching et al. |
| 2014/0295774 A1 | 10/2014 | Wu et al. |
| 2015/0085709 A1 | 3/2015 | Lee et al. |
| 2016/0156380 A1 | 6/2016 | Rafi et al. |
| 2019/0089396 A1 | 3/2019 | Kim et al. |

FIG. 12

| TX mode | DA | PA | SW1 | SW2 | SW3 |
|---|---|---|---|---|---|
| High Power (TX1 mode) | ON | ON | OFF | ON | OFF |
| Low Power (TX1 mode) | ON | OFF | ON | OFF | ON |
| TX2 mode | ON | OFF | ON | OFF | ON |

TRANSMITTER DEVICE AND TRANSCEIVER DEVICE FOR TRANSMITTING DIFFERENT WIRELESS STANDARD SIGNAL

CROSS-REFERENCE TO RELATED APPLICATIONS

This application is a continuation of U.S. patent application Ser. No. 15/988,147 filed on May 24, 2018, which claims the benefit of priority under 35 U.S.C. § 119 from Korean Patent Application No. 10-2017-0119720 filed on Sep. 18, 2017, in the Korean Intellectual Property Office, the entire contents of which are incorporated by reference herein.

1. TECHNICAL FIELD

Embodiments of the inventive concept described herein relate to a semiconductor device, and more particularly, relate to a transmitter device and a transceiver device for transmitting wireless signals of different standards.

2. DISCUSSION OF THE RELATED ART

Recently, there has been a significant increase in the use of a mobile device such as a smartphone, a tablet personal computer (PC), a digital camera, an MP3 player, or a personal digital assistant (PDA). Wireless network technologies of various standards are being applied to mobile devices for purposes such as data exchange, electronic payment, wireless tags, etc. For example, Bluetooth and a wireless local area network (hereinafter referred to as "WLAN") are the most popular wireless network technologies. Bluetooth and WLAN are wireless communication protocols designed to provide wireless connectivity. Also, Bluetooth and WLAN use the same frequency band.

Generally, Bluetooth is used to implement a personal area network (PAN) within a coverage area, the radius of which is several meters. For example, Bluetooth may be used to connect personal computers, PDAs, mobile phones, wireless headsets, etc. In contrast, WLAN may be used to interconnect local devices by using wireless fidelity (Wi-Fi) or a network protocol such as IEEE 802.11 wireless protocol.

One of the characteristics of wireless network protocols is the similarity between radio frequencies used for transmission. Accordingly, a mobile device operating in various network protocols may share an antenna to reduce costs and a size of the mobile device. However, different wireless network protocols may use different transmission power, and may exhibit different impedances from each other in the various wireless network protocols. Accordingly, there is a demand for switches for the purpose of separating operation modes and matching the different impedances. However, the costs for such switches are typically quite high. For example, even though a transceiver combo for transmitting and receiving wireless signals of different standards may be implemented in one chip, the use of high-priced switches that are external to a transceiver combo chip causes an increase in the size and the costs of an electronic device.

SUMMARY

Embodiments of the inventive concept provide a technology for implementing transceiver modules of different standards that may share an antenna within a single chip. Also, embodiments of the inventive concept provide a wireless transceiver device capable of sharing an antenna by implementing an impedance matching circuit and a switch within a single chip.

According to an embodiment of the inventive concept, a transmitter device, which transmits a first transmit signal and a second transmit signal having different wireless communication standards, includes a power amplifier that amplifies power of the first transmit signal in a first transmission mode, a first impedance circuit that provides the power-amplified first transmit signal to a radio frequency output port, a second impedance circuit that is connected to the first impedance circuit and provides an additional impedance to the first impedance circuit in the first transmission mode, a switch unit configured to select the first transmit signal or the second transmit signal of different wireless communication standards, the switch unit including a first switch that provides the second transmit signal to the first impedance circuit in a second transmission mode, and a second switch that connects the second impedance circuit and a ground in the first transmission mode and floats the second impedance circuit in the second transmission mode.

According to an embodiment of the inventive concept, a transmitter device, which transmits a first transmit signal and a second transmit signal of different wireless communication standards, includes a power amplifier that amplifies power of the first transmit signal in a high power mode of a first transmission mode, a first impedance circuit that provides the power-amplified first transmit signal to a radio frequency output port, a first switch that provides the first transmit signal or the second transmit signal to the first impedance circuit in a low power mode of the first transmission mode or a second transmission mode, a second impedance circuit that is connected to the first impedance circuit and provides an additional impedance to the first impedance circuit in the high power mode, a second switch that connects the second impedance circuit and a ground in the high power mode and floats the second impedance circuit in the low power mode or the second transmission mode, and a third impedance circuit that provides the first transmit signal to the power amplifier in the high power mode, provides the first transmit signal to the first switch in the low power mode, and provides the second transmit signal to the first switch in the second transmission mode.

According to an embodiment of the inventive concept, the first transmit signal and the second transmit signal utilize a same frequency band.

According to an embodiment of the inventive concept, the first transmit signal is a Bluetooth signal, and the second transmit signal is a Wi-Fi signal.

According to an embodiment of the inventive concept, a transceiver device includes a transmitter combo circuit comprising a power amplifier, an impedance unit including a first impedance circuit and a second impedance circuit, and a switch unit including a first switch that controls flow of a second transmit signal to a node connected to the first impedance circuit, and a second switch that controls connection of the second impedance circuit to ground, and the transmitter combo circuit provides a first transmit signal to a transmission port in a first transmission mode via the first impedance circuit, and provides a second transmit signal which has a wireless communication standard of that is different from a wireless communication standard of the first transmit signal, to the transmission port in a second transmission mode, an antenna that is connected with the transmission port and radiates the first transmit signal or the second transmit signal from the transmitter combo circuit to a radio channel, a receiver that samples a receive signal provided from the antenna through a reception port connected with the antenna, and a matching network that is connected between the transmission port and the reception port and provides a matching impedance corresponding to each of a transmission mode and a reception mode.

According to an embodiment of the inventive concept, a transceiver device includes a transceiver combo chip having a transmitter combo circuit configured to receive baseband signals, and to provide a first transmit signal with a radio frequency band to a transmission port in a first transmission mode and to provide a second transmit signal in the radio frequency band, a wireless communication standard of which is different from a wireless communication standard of the first transmit signal, to the transmission port in a second transmission mode; a receiver configured to sample the received signal; a matching network connected between the transmission port and a reception port and configured to provide a matching impedance corresponding to each of a transmission mode and a reception mode; and an antenna connected to the transmission port and configured to radiate the first transmit signal or the second transmit signal from the transmitter combo circuit to a radio channel, and to provide to the receiver the received signal through a reception port connected with the antenna. The transmitter combo circuit includes a switch unit for selecting the first transmit signal or the second transmit signal.

According to an embodiment of the inventive concept, a switch controller selects a path for transmission of the first transmit signal or the second transmit signal, depending on a transmission mode.

According to an embodiment of the inventive concept, a baseband modem is configured to modulate an input of transmission data to generate the baseband signals provided to the transmitter combo circuit, and to demodulate a received signal from the receiver to generate received data.

BRIEF DESCRIPTION OF THE DRAWINGS

Embodiments of the inventive concept will become better appreciated by a person of ordinary skill in the art from the following description with reference to the following drawings, wherein like reference numerals refer to like parts throughout the various figures unless otherwise specified, and wherein:

FIG. 12 is a table illustrating states of an amplifier and switches in a transmission mode of the transmitter combo circuit of FIG. 11;

DETAILED DESCRIPTION

Figure 1:
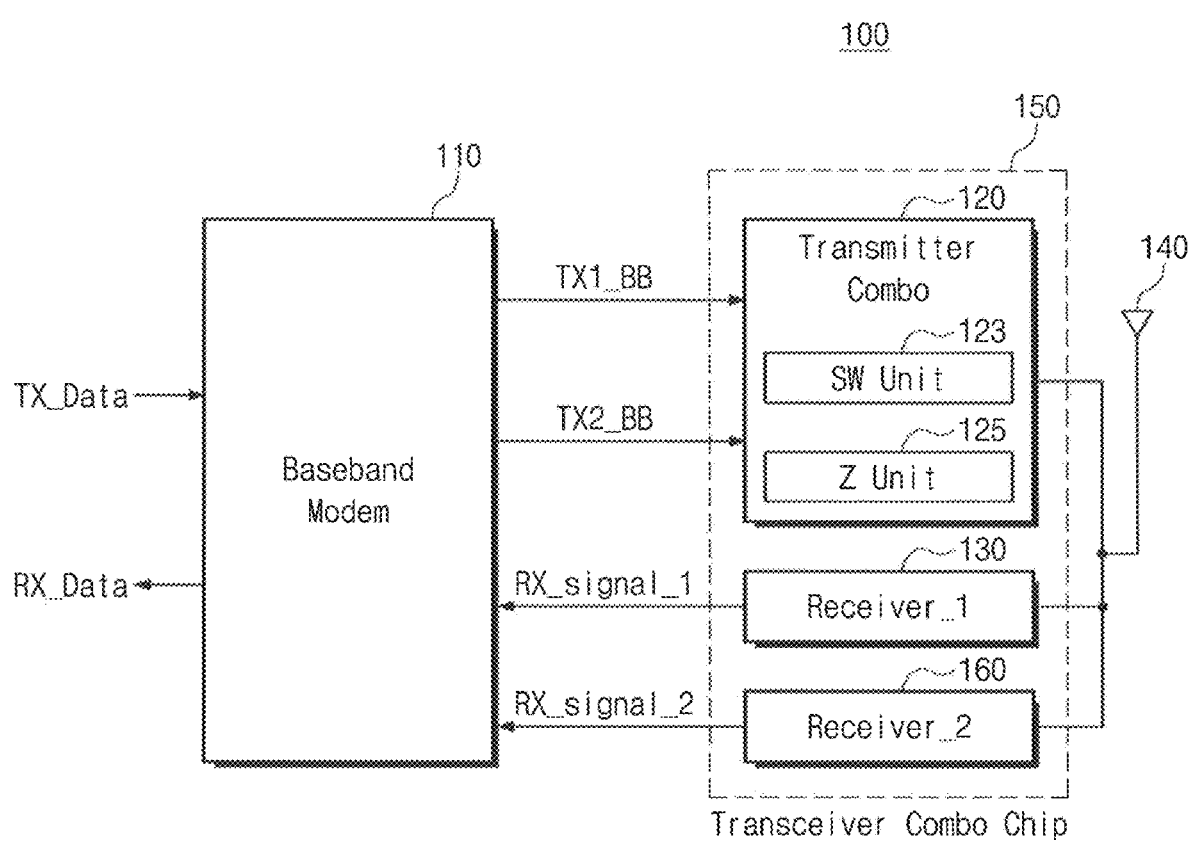
FIG. 1 is a block diagram illustrating a wireless transceiver according to an embodiment of the inventive concept.

Embodiments of the inventive concept will now be described in detail with reference to the attached drawings. FIG. 1 is a block diagram illustrating a wireless transceiver according to an embodiment of the inventive concept. Referring to FIG. 1, a transceiver device 100 may include a baseband modem 110, a transmitter combo circuit 120, a first receiver 130, a second receiver 160, and an antenna 140. The transmitter combo circuit 120 and the first receiver 130 and the second receiver may constitute a transceiver combo chip 150 being a single integrated circuit chip.

The baseband modem 110 modulates transmission data TX_Data to generate transmit signals TX1_BB and TX2_BB of a baseband that are provided to the transmitter combo circuit 120. Here, the first transmit signal TX1_BB is a baseband transmit signal of a first wireless communication standard. The second transmit signal TX2_BB is a baseband transmit signal of a second wireless communication standard different from the first wireless communication standard. The baseband modem 110 receives and processes a receive signal RX_signal from the receiver 130. The baseband modem 110 may demodulate the receive signal RX_signal to obtain data RX_Data and may provide the demodulated data RX_Data to a processor (not illustrated). Here, the first wireless communication standard and the second wireless communication standard are Wi-Fi and Bluetooth, respectively. A person of ordinary skill in the art should understand and appreciate that the inventive concept is not limited to Wi-Fi and Bluetooth communication standards. For example, the inventive concept may be implemented using a Near Field Communication (NFC) standard, or a radio frequency identification (RFID) standard, just to name some non-limiting examples. In addition, a high power mode and a low power mode may be, for example, Bluetooth and Bluetooth Low Energy (LE). However, a person of ordinary skill in the art should understand and appreciate that according to an embodiment of the inventive concept, a combination of the first wireless communication standard and the second wireless communication standard may be different communication standards than shown and described herein. When the first wireless communication standard and the second wireless communication share a common frequency band, a same antenna may be used for transmission of the signals having different communication standards.

The transmitter combo circuit 120 modulates the baseband transmit signals TX1_BB and TX2_BB to output signals having a radio frequency (RF signals). The transmitter combo circuit 120 transmits the modulated transmit signals having a radio frequency to the antenna 140. Below, the baseband transmit signals may be marked by "TX1_BB" and "TX2_BB", and the transmit signals having the radio frequency may be marked by "TX1" and "TX2".

With continued reference to FIG. 1, in a first transmission mode (TX1 mode), the transmitter combo circuit 120 may select and amplify the first transmit signal TX1 and may transmit the amplified signal to the antenna 140. In contrast, in a second transmission mode (TX2 mode), the transmitter combo circuit 120 may select and amplify the second transmit signal TX2 and may transmit the amplified signal to the antenna 140.

The transmitter combo circuit 120 may include a switch unit 123 for selecting any one of the transmit signals of different standards depending on a transmission mode and an impedance unit 125. The switch unit 123 selects a path through which a transmit signal having a radio frequency is transmitted, depending on a transmission mode. For example, it may be desirable to change a gain or output that the transmitter combo circuit 120 provides depending on a transmission mode. Thus, a transmit signal path of a radio frequency corresponding to each transmission mode may be selected. The impedance unit 125 provides a matching impedance defined in each standard depending on a transmission mode.

The first receiver 130 and the second receiver 160 sample and convert a wireless signal received through the antenna 140 to baseband receive signals RX_signal_1 and RX_signal_2. For example, WLAN and Bluetooth use similar radio frequency bands. Accordingly, wireless signals of the communication standards may be received through the shared antenna 140. The first receiver 130 and the second receiver 160 may provide the sampled receive signals RX_signal_1 and RX_signal_2 to the baseband modem 110.

The antenna 140 transmits a transmit signal of a radio frequency provided by the transmitter combo circuit 120 to a radio channel. In addition, the antenna 140 converts a receive signal of a radio frequency received over the radio channel to an electrical signal. A person of ordinary skill in the art should understand that a duplexer (not illustrated) for selecting and branching a reception mode and a transmission mode may be included in the antenna 140. For example, the antenna 140 may include a band pass filter (BPF) to select only a transmit signal of a radio frequency and a band pass filter (BPF) to select only a receive signal of a radio frequency. However, since the antenna 140 is not significantly associated with a function of the transmitter combo circuit 120, a detailed configuration of the antenna 140 will not be described. A person of ordinary skill in the art should understand and appreciate that although the example shows a single antenna, it is within the inventive concept that there may be more than one antenna. For example, if there was an additional frequency bands there may be an antenna for the additional band.

In addition, in an embodiment of the inventive concept, there may be an antenna array, for example, an array of two or more dipoles, monopoles, etc., for digital beam forming, and for multiple in, multiple out (MIMO) arrangement to reduce or eliminate multipath reflection errors.

Here, the transmitter combo circuit 120 and the first receiver 130 and/or the second receiver 160 may be integrated into a single chip. For example, the transmitter combo circuit 120 and the first receiver 130 and/or the second receiver 160 may constitute the transceiver combo chip 150. The transmitter combo circuit 120 included in the transceiver combo chip 150 includes the switch unit 123 and the impedance unit 125 for transmitting transmit signals of different standards. Accordingly, the transceiver combo chip 150 according to the inventive concept may be implemented without a high-priced switching device, such as a switching device external to the transmitter combo circuit 120 for changing a transmission mode between the transceiver combo chip 150 and the antenna 140. Accordingly, manufacturing or operating costs of the transceiver device 100 adopting the transceiver combo chip 150 may effectively decrease, and the size of the transceiver device 100 may also be decreased without an externally arranged switching device.

Figure 2:
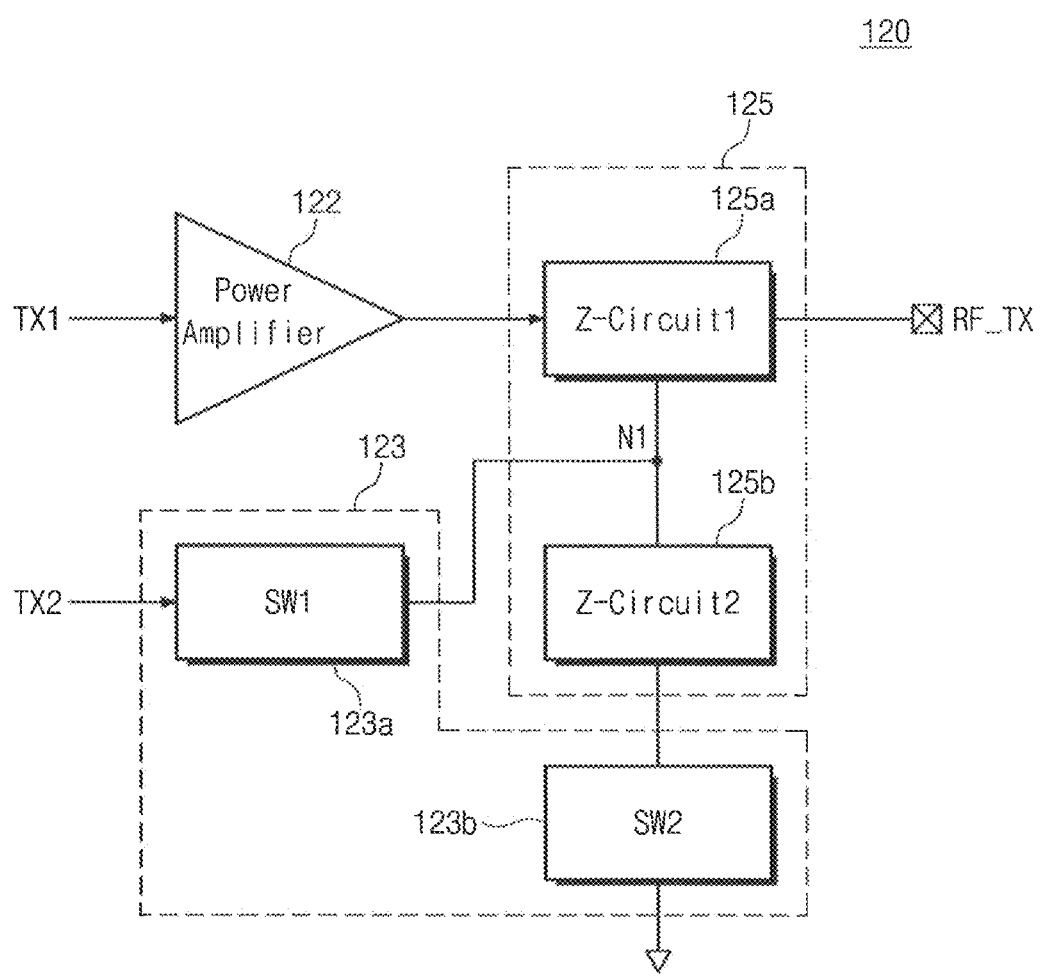
FIG. 2 is a block diagram illustrating a configuration of a transmitter combo circuit of FIG. 1.

FIG. 2 is a block diagram illustrating an example of a configuration of a transmitter combo circuit 120 of FIG. 1. Referring to FIG. 2, the transmitter combo circuit 120 includes a power amplifier 122, the switch unit 123, and the impedance unit 125. The switch unit 123 may include a first switch 123a and a second switch 123b. The impedance unit 125 may include a first impedance circuit 125a and a second impedance circuit 125b.

The power amplifier 122 may amplify the power of the first transmit signal TX1, and may output the power-amplified first transmit signal TX1 to the first impedance circuit 125a. In the first transmission mode, the power amplifier 122 may amplify the whole power of the first transmit signal TX1 to a level capable of being radiated through the antenna 140. The power amplifier 122 may be selected from various classes of amplifiers classified according to a shape of an output waveform. For example, the first transmit signal TX1 may be a Wi-Fi transmit signal applied to a mobile terminal. The Wi-Fi standard used in the mobile terminal may be at least one from the 802.11 family, e.g., 802.11a/b/g/n/ac or 802.11ad/ah/af, etc. Also, in view of the current adjustments to the error vector magnitude (EVM) specification to satisfy the next-generation Wi-Fi standard, the power amplifier 122 is configured to receive a varied (e.g., a higher) amplifier bias voltage.

The switch unit 123 may include the first switch 123a and the second switch 123b. The first switch 123a provides the second transmit signal TX2 of a radio frequency to a first node N1 in the second transmission mode. In contrast, in the first transmission mode, the first switch 123a blocks the second transmit signal TX2 so as not to be provided to the first node N1.

The second switch 123b provides an electrical path between the second impedance circuit 125b and a ground in the first transmission mode. Accordingly, in the first transmission mode, an output impedance of a radio frequency output port RF_TX is set by the first impedance circuit 125a and the second impedance circuit 125b. In contrast, in the second transmission mode, the second switch 123b disconnects the second impedance circuit 125b from the ground. Accordingly, in the second transmission mode, the output impedance of the radio frequency output port RF_TX is set by only the first impedance circuit 125a.

The impedance unit 125 outputs the first transmit signal TX1 amplified by the power amplifier 122 to the radio frequency output port RF_TX. The first impedance circuit 125a and the second impedance circuit 125b may form an impedance of an output port for transmitting the first transmit signal TX1 in compliance with the first wireless communication standard. For example, the first impedance circuit 125a and the second impedance circuit 125b may provide impedance matching for providing the first transmit signal TX1 amplified by the power amplifier 122 to the antenna 140 with minimum attenuation. Power of the first transmit signal TX1 may be transmitted to the antenna 140 with optimum efficiency by the impedance formed by the first impedance circuit 125a and the second impedance circuit 125b.

A schematic structure of the transmitter combo circuit 120 of an embodiment of the inventive concept is described above. The transmitter combo circuit 120 of an embodiment of the inventive concept includes the power amplifier 122 that is activated only in the first transmission mode. A result of the power amplifier 122 only being activated in the first transmission mode is that the first transmit signal TX1 amplified is output to the radio frequency output port RF_TX. In the first transmission mode, the output impedance is formed by the first impedance circuit 125a and the second impedance circuit 125b. In contrast, in the second transmission mode, the first switch 123a is turned on to output the second transmit signal TX2 to the radio frequency output port RF_TX. In addition, since the second switch 123b is turned off in the second transmission mode TX2 mode, the output impedance is formed by only the first impedance circuit 125a.

Figure 3:
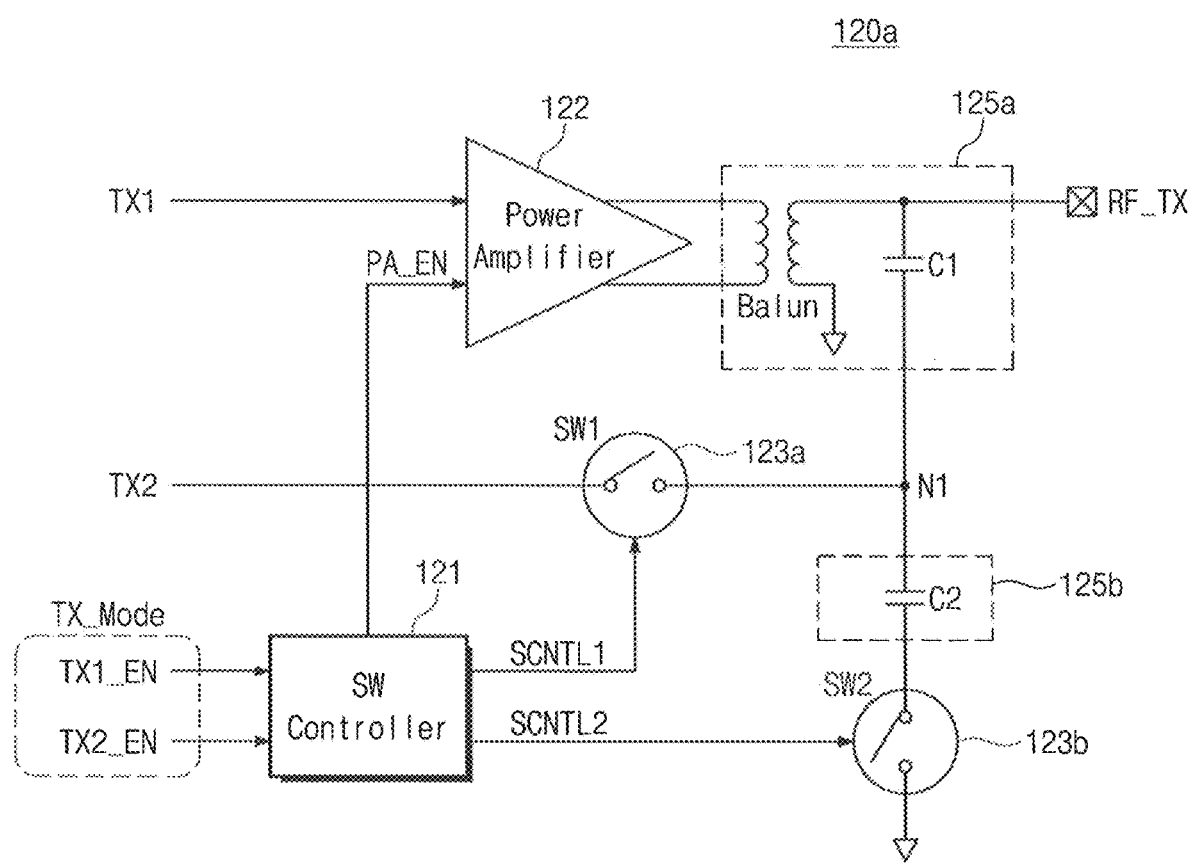
FIG. 3 is a block diagram illustrating an exemplary configuration of the transmitter combo circuit of FIG. 2.

FIG. 3 is a block diagram illustrating an exemplary configuration of a transmitter combo circuit of FIG. 2. Referring to FIG. 3, a transmitter combo circuit 120a includes a switch controller 121, the power amplifier 122, the first switch 123a, the second switch 123b, the first impedance circuit 125a, and the second impedance circuit 125b.

The switch controller 121 controls the power amplifier 122 and the first switch 123a and the second switch 123b depending on a transmission mode. For example, the switch controller 121 generates an amplifier enable signal PA_EN for activating the power amplifier 122 depending on the transmission mode TX_mode. Also, the switch controller 121 generates a switch control signal SCNTL1 for controlling the first switch 123a, and a switch control signal SCNTL2 for controlling the second switch 123b, depending on the transmission mode.

If a first transmission mode TX1_EN is activated, the switch controller 121 activates the amplifier enable signal PAEN for the purpose of turning on the power amplifier 122. The switch controller 121 may output the switch control signal SCNTL1 to turn off the first switch 123a. Also, the switch controller 121 may output the switch control signal SCNTL2 to turn on the second switch 123b. Here, each of the first switch 123a and the second switch 123b may be implemented with a transistor.

The first transmit signal TX1 may be amplified by the power amplifier 122 in an enabled state of the first transmission mode TX1_EN. The power amplifier 122 outputs the amplified first transmit signal TX1 to a balanced input port of the balun. The amplified first transmit signal TX1 provided to the balanced input port is output to an unbalanced output port by the induction action of the balun. The first transmit signal TX1 is output to the radio frequency output port RF_TX at which the unbalanced output port of the balun is connected with the antenna 140. In this case, the second switch 123b has been turned on, which causes an output impedance value of the radio frequency output port RF_TX to be determined by the balun and first and second capacitors C1 and C2.

In contrast, with continued reference to FIG. 3, the power amplifier 122 is turned off in an enabled state of a second transmission mode TX2_EN. Accordingly, a transmission path of the first transmit signal TX passing through the power amplifier 122 may be blocked. However, as the first switch 123a is turned on and the second switch 123b is turned off, the second transmit signal TX2 may be output to the radio frequency output port RF_TX. In this case, the output impedance value of the radio frequency output port RF_TX is determined by the first capacitor C1. As the second switch 123b is turned off, the second capacitor C2 is disconnected from the ground, and thus, is floated.

A configuration and an operation of the transmitter combo circuit 120a according to an embodiment of the inventive concept have been briefly described hereinabove. The transmitter combo circuit 120a of an embodiment of the inventive concept may transmit, for example, wireless signals of different standards in a time-division manner by using the first switch 123a and the second switch 123b and the first impedance circuit 125a and the second impedance circuit 125b, which may be integrated into a chip. For example, switching may be made within the transmitter combo circuit 120a depending on an enabled state of the first transmission mode TX1_EN and the second transmission mode TX2_EN, and thus, the output impedance may also be adjusted.

Figure 4:
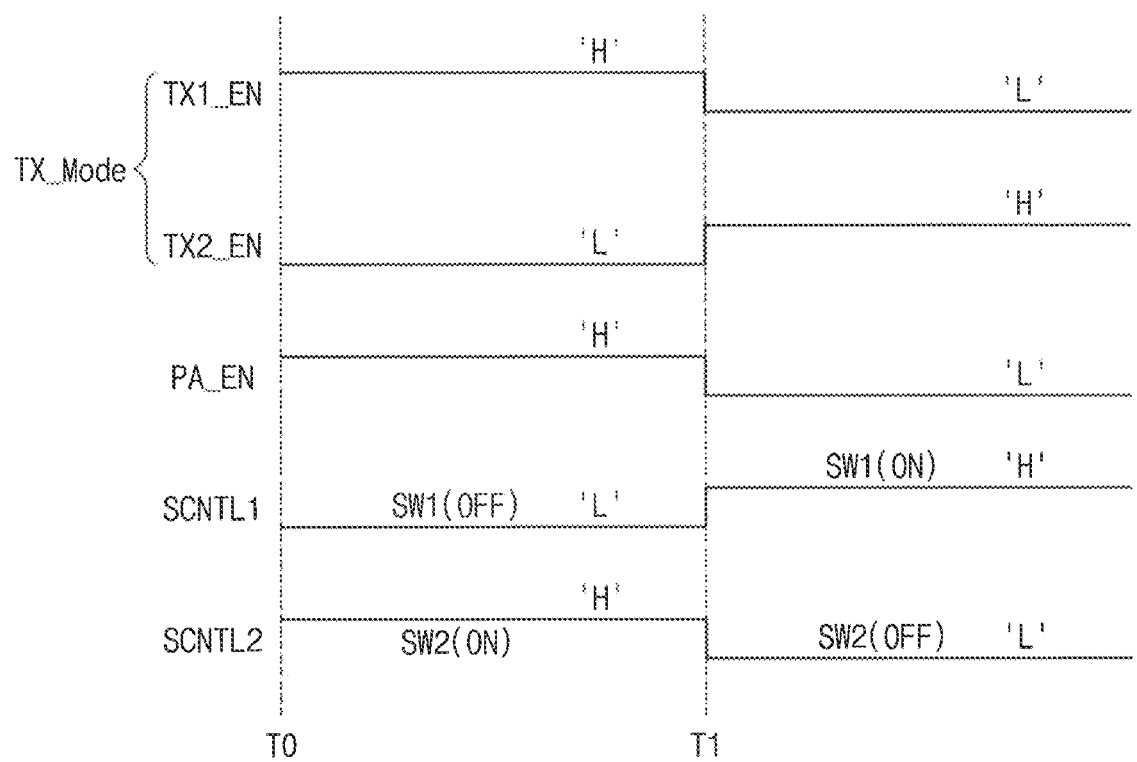
FIG. 4 is a timing diagram illustrating an operation of a switch controller of FIG. 3, which is performed according to a transmission mode.

FIG. 4 is a timing diagram illustrating an operation of a switch controller of FIG. 3, which is performed according to a respective transmission mode. Referring to FIG. 4, the switch controller 121 controls the power amplifier 122 and the first switch 123a and the second switch 123b depending on the transmission mode.

With reference to FIG. 4, it is assumed that the transmission mode (TX_mode) is an enabled state of the first transmission mode TX1_EN at T0. For example, it is assumed that the first transmission mode TX1_EN of a logical high (H) state and the second transmission mode TX2_EN of a logical low (L) state are provided to the switch controller 121 at T0. When the assumed transmission mode is the first transmission mode TX1_EN, the switch controller 121 (FIG. 3) activates the amplifier enable signal PA_EN to the logical high state. Also, the switch controller 121 may output the switch control signal SCNTL1 of the logical low state (to block TX2) and the switch control signal SCNTL2 of the logical high state.

From T0 to T1, under control of the switch controller 121, the power amplifier 122 may amplify the power of the first transmit signal TX and may output the power-amplified first transmit signal TX1 to a balun side of the first impedance circuit 125a. In addition, the second transmit signal TX2 is blocked by the first switch 123a being turned off (e.g., in an open state). As the second switch 123b is turned on, the second capacitor C2 is connected to ground. As such, the amplified first transmit signal TX1 may be output to the radio frequency output port RF_TX having an output impedance formed by the balun and the serially connected capacitors C1 and C2. The radio frequency output port RF_TX is a port directly connected to the antenna 140 as an output port of the transceiver combo chip 150 (see FIG. 1).

At T1, the transmission mode TX_mode is changed from the enabled state of the first transmission mode TX1_EN to the enabled state of the second transmission mode TX2_EN. For example, the first transmission mode TX)_EN may transition to the logical low state, and the second transmission mode TX2_EN may transition to the logical high state. In this case, the switch controller 121 deactivates the amplifier enable signal PA_EN to the logical low state. Also, the switch controller 121 may output the switch control signal SCNTL1 of the logical high state and the switch control signal SCNTL2 of the logical low state.

In the enabled state of the second transmission mode TX2_EN, the power amplifier 122 is turned off under control of the switch controller 121. The second transmit signal TX2 is output to the first node N1 through the first switch 123a turned on. In addition, as the second switch 123b is turned off, the second capacitor C2 is separated from the ground (e.g., floats). As a result of the changes to the operation of the transmitter combo circuit 120a (FIG. 3), the second transmit signal TX2 may be provided to the radio frequency output port RF_TX through the first switch 123a and via first node N1 to the first capacitor C1. For example, in the enabled state of the second transmission mode TX2_EN, an output impedance of the radio frequency output port RF_TX may be set to an impedance value determined by the first capacitor C1. Accordingly, this embodiment of the inventive concept illustrates that an output impedance suitable for in each transmission mode may be provided through selection of the inductance of the balun and the capacitance of the capacitors C1 and C2.

Figure 5:
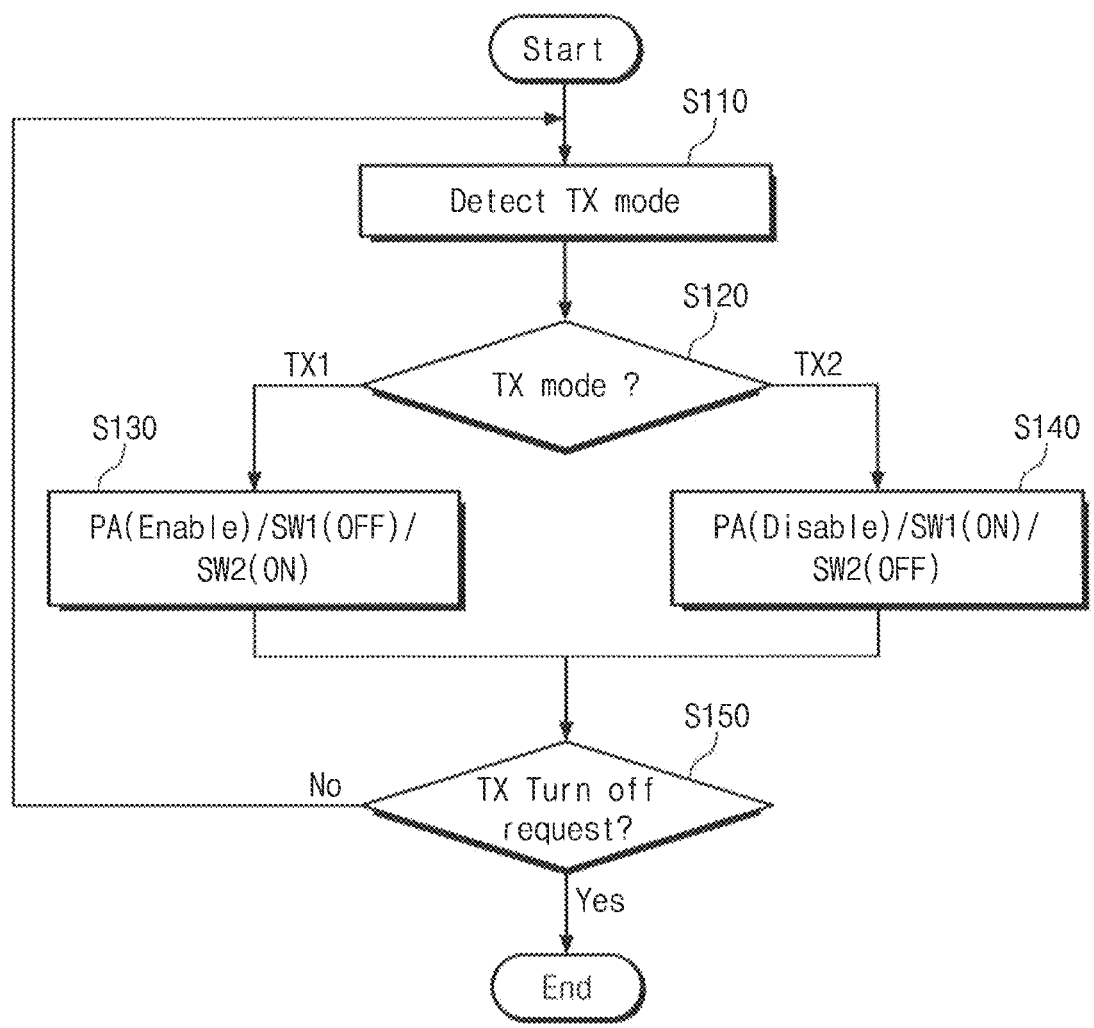
FIG. 5 is a flowchart illustrating an operation of the transmitter combo circuit of FIG. 3.

FIG. 5 is a flowchart illustrating an example of an operation of the transmitter combo circuit such as shown in FIG. 3. Referring to FIG. 5, the transmitter combo circuit 120a may select any one of the wireless signals depending on a transmission mode and may provide an output impedance corresponding to the transmission mode.

In operation S110, the transmitter combo circuit 120a detects the transmission mode. Here, it is assumed that the transmission mode comprises the first transmission mode and the second transmission mode. For example, the first transmission mode may refer to a mode for Wi-Fi transmission, and the second transmission mode may refer to a mode for Bluetooth transmission. However, a person of ordinary skill in the art should understand that the transmission modes of the inventive concept are not limited to the examples provided in this disclosure. Wi-Fi mode and Bluetooth mode are used for illustrative purposes.

In operation S120, the operation branch may be made according to the detected transmission mode. If the detected transmission mode is the first transmission mode (e.g., TX1 mode), then operation S130 is performed. If the detected transmission mode is the second transmission mode (e.g., TX2 mode), then operation S140 is performed.

In operation S130, the switch controller 121 turns on the power amplifier 122. Also, the switch controller 121 generates the switch control signal SCNTL1 having a logical low state and the switch control signal SCNTL2 having a logical high state. Referring to FIG. 3, the first switch 123a is turned off by the switch control signal SCNTL1, and the second switch 123b is turned on by the switch control signal SCNTL2. Since the first switch 123a is turned off, the second transmit signal TX2 to be output to the radio frequency output port RF_TX is blocked. In contrast, the first transmit signal TX1 may be output to the radio frequency output port RF_TX after being amplified by the power amplifier 122. In this case, the output impedance of the radio frequency output port RF_TX is determined by the balun and the serially connected capacitors C1 and C2.

In operation S140, the switch controller 121 turns off the power amplifier 122. Also, the switch controller 121 sets the switch control signal SCNTL1 to the logical high state and the switch control signal SCNTL2 to the logical low state. The first switch 123a is turned on by the switch control signal SCNTL1, and the second switch 123b is turned off by the switch control signal SCNTL2. Since the second switch 123b is turned off, the first transmit signal TX1 to be output to the radio frequency output port RF_TX is blocked. In contrast, the second transmit signal TX2 may be output to the radio frequency output port RF_TX. In this case, the output impedance value of the radio frequency output port RF_TX is determined by the capacitor C1.

With continued reference to FIG. 5, in operation S150, the transmitter combo circuit 120a detects whether a turn-off request exists. For example, the transmitter combo circuit 120a may be turned off when a turn-off request of a device or system equipped with the transceiver device 100 is generated, or if a user requests to change operation to a power saving mode. If there is not a turn-off request associated with the transmitter combo circuit 120a (e.g., No), the process will again perform operation S110. In contrast, if there is a turn-off request associated with the transmitter combo circuit 120a (e.g., Yes), the overall operations of the transmitter combo circuit 120a end.

The operations of the power amplifier 122 and the first switch 123a and the second switch 123b, which are performed according to the transmission mode, are briefly described above. Information about a change in the transmission mode may be provided from the baseband modem 110 (refer to FIG. 1), a processor, etc.

Figure 6:
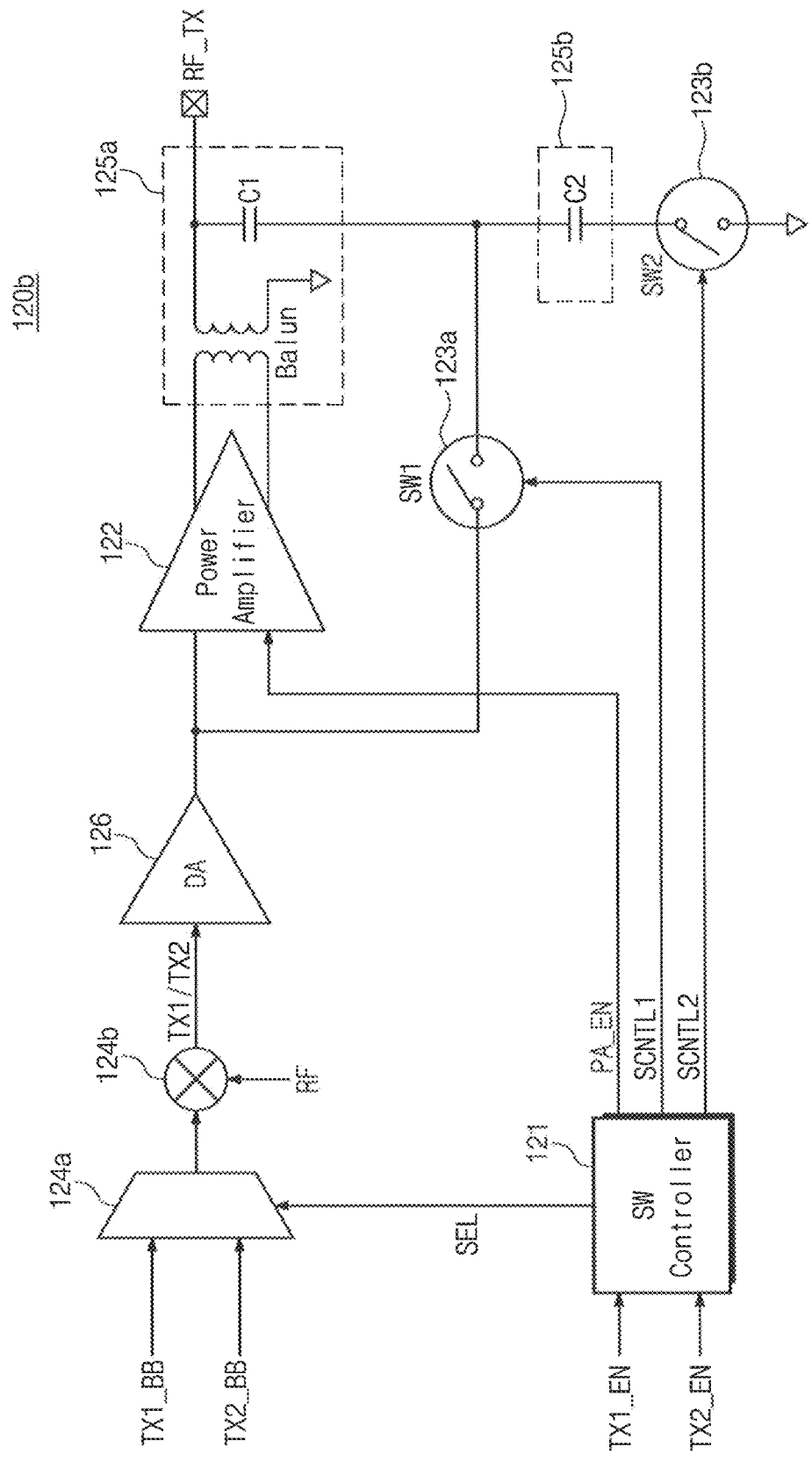
FIG. 6 is a block diagram illustrating another example of the transmitter combo circuit of FIG. 2.

FIG. 6 is a block diagram illustrating another example of a transmitter combo according to an embodiment of the inventive concept. Referring to FIG. 6, a transmitter combo circuit 120b may include the switch controller 121, the power amplifier 122, the first switch 123a, the second switch 123b, the first impedance circuit 125a, the second impedance circuit 125b, a multiplexer 124a, a mixer 124b, and a driving amplifier 126. Here, the switch controller 121, the power amplifier 122, the first switch 123a, the second switch 123b, the first impedance circuit 125a, and the second impedance circuit 125b are substantially the same as those of FIG. 3, and thus, a detailed description thereof will not be repeated here.

The switch controller 121 controls the power amplifier 122, the first switch 123a, and the second switch 123b, and the multiplexer 124a depending on a transmission mode TX_mode. The switch controller 121 generates the amplifier enable signal PA_EN for activating the power amplifier 122 depending on the transmission mode. Also, the switch controller 121 generates the switch control signal SCNTL1 for controlling the first switch 123a and the switch control signal SCNTL2 for controlling the second switch 123b, depending on the transmission mode (e.g. TX1_EN or TX2_EN). The procedure for the switch controller 121 to control the power amplifier 122, the first switch 123a, and the second switch 123b is the same as described with reference to FIG. 3.

In addition, if the first transmission mode TX1_EN is activated, the switch controller 121 may generate a selection signal SEL to allow the multiplexer 124a to select a first transmit signal TX1_BB of a baseband. If the second transmission mode TX2_EN is activated, the switch controller 121 may generate the selection signal SEL to allow the multiplexer 124a to select a second transmit signal TX2_BB of a baseband. It should be understood and appreciated that the inventive concept is not limited to the examples shown and described above. For example, there could be additional baseband transmit signals than a first transmit TX1_BB and a second transmit TX2_BB. With additional baseband signals, there may be additional switches under the control of the switching controller.

The multiplexer 124a may select the first transmit signal TX1_BB or the second transmit signal TX2_BB of the baseband in response to the selection signal SEL.

The mixer 124b has a radio frequency (RF) input and modulates the first transmit signal TX1_BB and the second transmit signal TX2_BB of the baseband so as to have a radio frequency. More particularly, the first transmit signal TX1 or the second transmit signal TX2 modulated to the radio frequency and is output to the driving amplifier 126.

The driving amplifier 126 amplifies the first transmit signal TX1 or the second transmit signal TX2 of the radio frequency. In general, it is difficult to satisfy both gain and power due to a structural characteristic of an amplifier. In the first transmission mode in which high transmission power is utilized, the power amplifier 122 may be turned on to amplify the power of the first transmit signal TX1. The gain utilized in the first transmission mode may be provided through the driving amplifier 126. The first transmit signal TX1 may be provided to the radio frequency output port RF_TX with the gain and output provided through the driving amplifier 126 and the power amplifier 122.

In the second transmission mode in which transmission power is relatively lower than the high transmission power of the first transmission mode, the power amplifier 122 is turned off, and the second transmit signal TX2 is amplified only by the driving amplifier 126. The second transmit signal TX2 may be provided to the radio frequency output port RF_TX through the first switch 123a and the first capacitor C1.

In addition, the above-described transmitter combo circuit 120b has a structure including one driving amplifier 126 and one power amplifier 122. Accordingly, in the case where the structure of the transmitter combo circuit 120b illustrated in FIG. 6 is applied to the transceiver device 100, it may be possible to manufacture the transceiver device 100 with relatively low costs.

Figure 7:
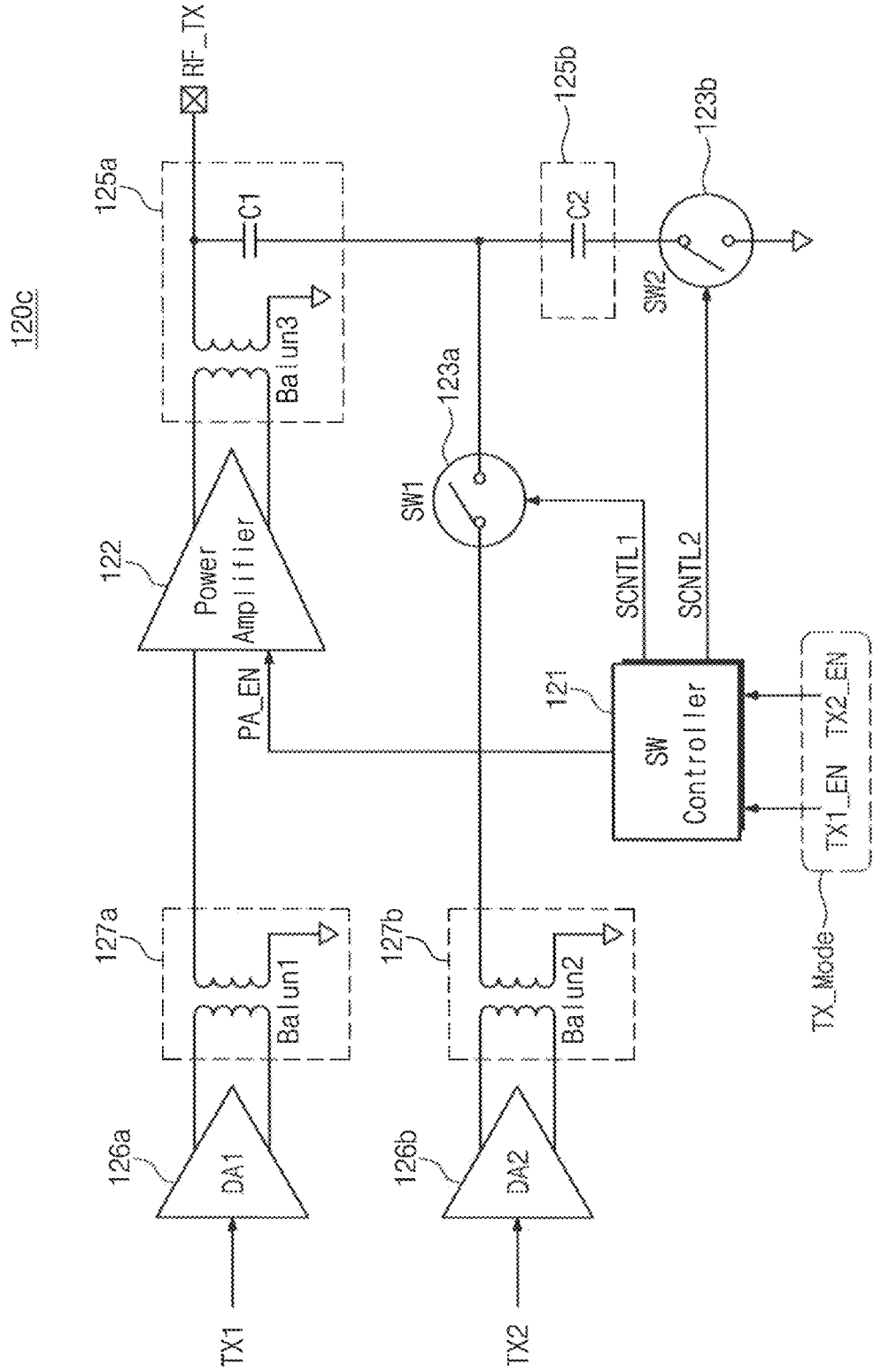
FIG. 7 is a circuit diagram illustrating another example of the transmitter combo circuit of n FIG. 2.

FIG. 7 is a circuit diagram illustrating another example of a transmitter combo circuit of FIG. 2. Referring to FIG. 7, a transmitter combo circuit 120 may include the switch controller 121, the power amplifier 122, the first switch 123a, the second switch 123b, the first impedance circuit 125a, the second impedance circuit 125b, first driving amplifier 126a and second driving amplifier 126b, and a first balun 127a, and a second balun 127b. Here, the switch controller 121, the power amplifier 122, the first switch 123a, the second switch 123b, the first impedance circuit 125a, and the second impedance circuit 125b are substantially the same as those of FIG. 3, and thus, a detailed description thereof will not be repeated here. In addition, it is assumed that each of the first transmit signal TX1 and the second transmit signal TX2 is a signal modulated at a radio frequency.

The first driving amplifier 126a amplifies the first transmit signal TX1, and the second driving amplifier 126b amplifies the second transmit signal TX2. The first transmit signal TX1 and the second transmit signal TX2 may be provided to the antenna 140 with different gains and power. In this case, the first driving amplifier 126a may be designed to provide an optimum gain for transmitting the first transmit signal TX1. Also, the second driving amplifier 126b may be set independently of the first driving amplifier 126a so as to provide an optimum gain for transmitting the second transmit signal TX2.

The first balun 127a and the second balun 127b convert the first and second transmit signals TX1 and TX2, which are respectively amplified by the first driving amplifier 126a and second driving amplifier 126b, to unbalanced signals. The first balun 127a outputs the first transmit signal TX1 amplified by the first driving amplifier 126a to an input of the power amplifier 122. The second balun 127b outputs the second transmit signal TX2 amplified by the second driving amplifier 126b to the first switch 123a. Here, the first balun 127a and the second balun 127b are not limited to a balanced input-unbalanced output manner. For example, the first balun 127a and the second balun 127b may be implemented in a balanced input-balanced output manner.

The transmitter combo circuit 120c FIG. 7 uses independent driving amplifiers and baluns depending on the transmission mode. Accordingly, interference between paths through which the first transmit signal TX1 and the second transmit signal TX2 are transferred may be minimized.

Figure 8:
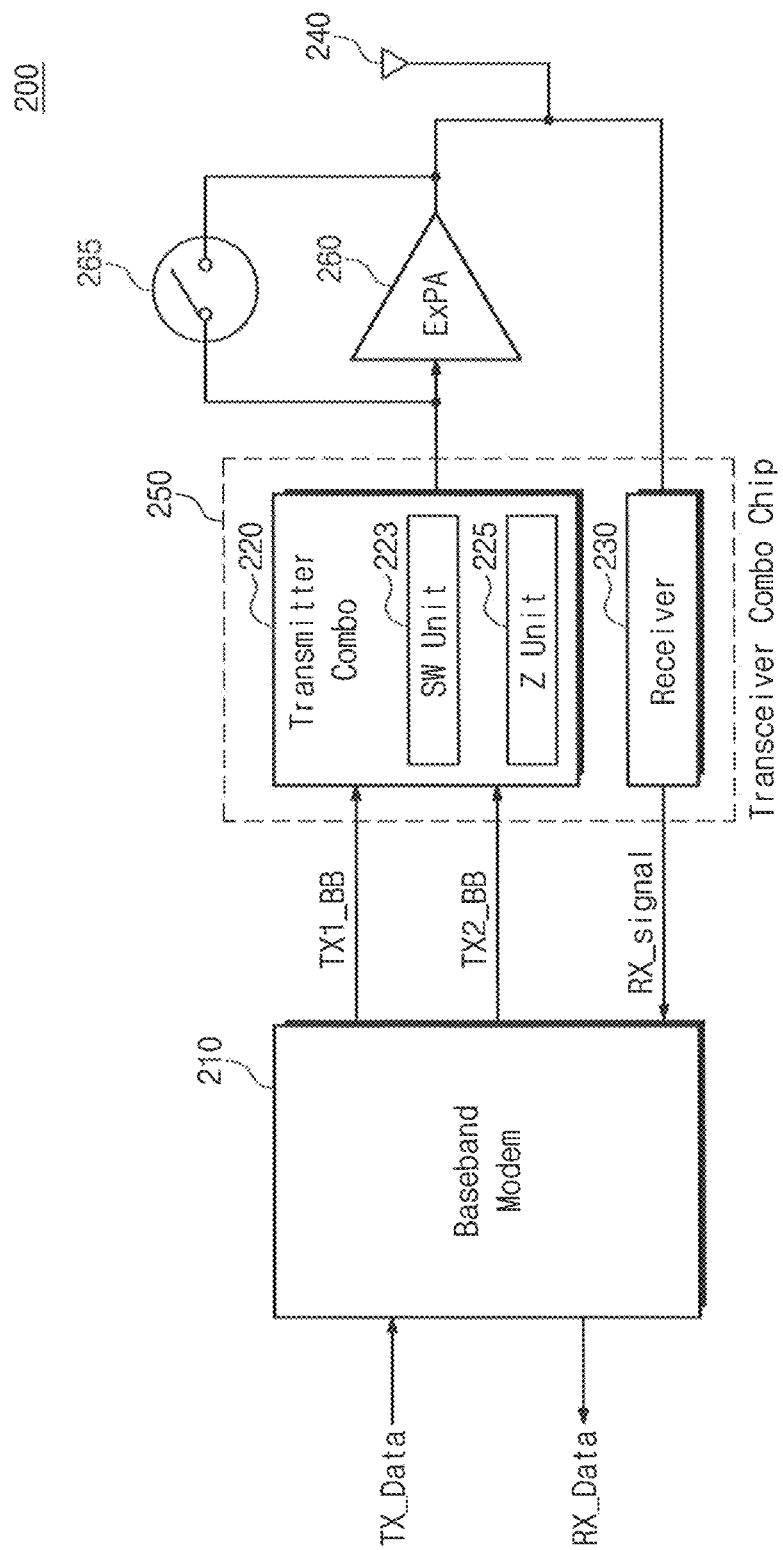
FIG. 8 is a block diagram illustrating the wireless transceiver according to an embodiment of the inventive concept.

FIG. 8 is a block diagram illustrating a wireless transceiver according to another embodiment of the inventive concept. Referring to FIG. 8, a wireless transceiver 200 may include a baseband modem 210, a transmitter combo circuit 220, a receiver 230, an antenna 240, an external power amplifier 260, and a switch 265. Here, the transmitter combo circuit 220 and the receiver 230 may constitute a transceiver combo chip 250 being a single integrated circuit chip. The transmitter combo circuit 220 may include the switch unit 223 and an impedance unit 225. Configurations and operations of the baseband modem 210 and the antenna 240 are substantially the same as described with reference to FIG. 1, and thus, a description thereof will not be repeated here.

The transmitter combo circuit 220 of the inventive concept operates in a state where the first transmission mode is divided into a high power (HP) mode and a low power (LP) mode. For example, in the case where power is difficult to supply by using a power amplifier PA included in the transmitter combo circuit 220, the power may be additionally amplified to a desired level by using the external power amplifier 260. In this case, the switch 265 is turned off, and power of the first transmit signal TX1 is amplified through the external power amplifier 260. Here, the output of the external power amplifier 260 may be greater than the output of the power amplifier PA included in the transmitter combo circuit 220.

In an embodiment of the inventive concept, in the high power mode of the first transmission mode, the external power amplifier 260 may be turned off and the switch 265 may be turned on. For example, the power of the first transmit signal TX1 is amplified only by the power amplifier PA included in the transmitter combo circuit 220. In contrast, in the low power mode of the first transmission mode, the external power amplifier 260 may be turned on and the switch 265 may be turned off. For example, in the low power mode of the first transmission mode, the first transmit signal TX1 may bypass the power amplifier PA included in the transmitter combo circuit 220 and may be amplified only by the external power amplifier 260. However, it should be understood that the first transmit signal TX1 may be amplified by both the power amplifier PA included in the transmitter combo circuit 220 and the external power amplifier 260 when there is a desire for a higher output. Of course, in the second transmission mode, the second transmit signal TX2 may be provided to the antenna 240 without amplification by any one of the power amplifier PA included in the transmitter combo circuit 220 and the external power amplifier 260. According to an embodiment of the inventive concept, amplification by the power amplifier PA included in the transmitter combo circuit may be used when the transmit signal is to be transmitted in a high power mode, and the power amplifier PA may be bypassed and the external amplifier 260 used when the transmit signal is to be transmitted in a low power mode. Alternatively, the high power mode may utilize both the power amplifier PA and the external amplifier 260.

The baseband modem 210 generates the baseband transmit signals TX1_BB and TX2_BB for transferring transmission data TX_Data to the transmitter combo circuit 220.

The first and second transmit signals TX1_BB and TX2_BB of the baseband are signals having different wireless communication standards. The baseband modem 210 receives and processes a receive signal RX_signal from the receiver 230 that is demodulated and output as received data (RX data).

The transmitter combo circuit 220 modulates the baseband transmit signals TX1_BB and TX2_BB to radio frequency band signals for transmission. The transmitter combo circuit 220 processes one of the modulated transmit signals (e.g., TX1 and TX2) of the radio frequency band and outputs the processed signal to the external power amplifier 260. In the case of transmitting the first transmit signal TX1, the transmitter combo circuit 220 processes and outputs the first transmit signal TX1 in the high power mode or the low power mode. To process the first transmit signal TX1 in the high power mode or the low power mode, the transmitter combo circuit 220 uses a switch unit 223 and an impedance unit 225. For example, in the high power mode, the transmitter combo circuit 220 amplifies the first transmit signal TX1 by using the power amplifier PA. In contrast, in the low power mode, the transmitter combo circuit 220 controls the switch unit 223 and the impedance unit 225 for the first transmit signal TX1 to bypass the power amplifier PA. The switch unit 223 and the impedance unit 225 may be controlled to provide the second transmit signal TX2 to the antenna 240 through a path different from a path of the low power mode or the high power mode.

A configuration and an operation of the receiver 230 are the same as those of the first receiver 130 and the second receiver 160 of FIG. 1, and thus, a description thereof will not be repeated here.

The transmitter combo circuit 220 and the receiver 230 may be integrated into a single chip. The transmitter combo circuit 220 and the receiver 230 may constitute a transceiver combo chip 250. The transmitter combo circuit 220 included in the transceiver combo chip 250 includes the switch unit 223 and the impedance unit 225 for transmitting transmit signals of different standards. The inclusion of the switch unit 223 and the impedance unit 224 in the transceiver combo chip 250 may eliminate the inclusion of a separate switching device for changing a transmission mode between the transceiver combo chip 250 and the antenna 240. In addition, the transmitter combo circuit 220 of the inventive concept may process the first transmit signal TX1 in the high power mode and the low power mode. In the case where the external power amplifier 260 is operated, the power amplifier PA included in the transceiver combo chip 250 may not be used. Accordingly, according to the transceiver combo chip 250 of the inventive concept, the first transmit signal TX1 may be transmitted at various power levels.

Figure 9:
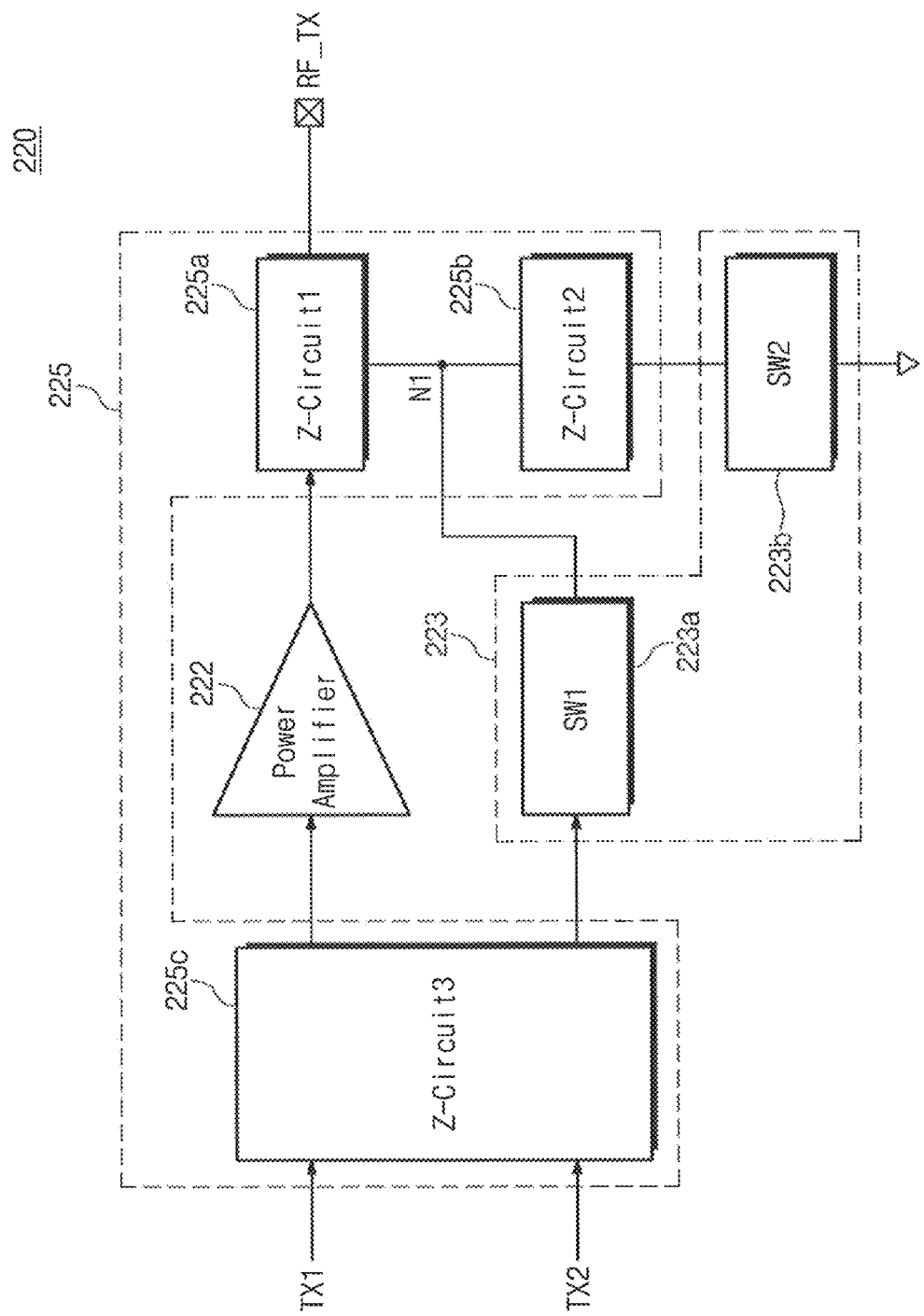
FIG. 9 is a block diagram illustrating a basic configuration of the transmitter combo circuit of FIG. 8.

FIG. 9 is a block diagram illustrating a basic configuration of a transmitter combo circuit of FIG. 8. Referring to FIG. 9, the transmitter combo circuit 220 includes a power amplifier 222, the switch unit 223, and the impedance unit 225. The switch unit 223 may include a first switch 223a and a second switch 223b. The impedance unit 225 may include a first impedance circuit 225a, a second impedance circuit 225b, and a third impedance circuit 225c.

In the transmitter combo circuit 220 of FIG. 9, a transmission mode may include two modes. For example, the transmission mode includes the first transmission mode and the second transmission mode. In addition, the first transmission mode may be subdivided into a high power mode and a low power mode.

The third impedance circuit 225c transfers the first transmit signal TX1 to one of the power amplifier 222 and the first switch 223a depending on the transmission mode. For example, in the high power mode of the first transmission mode, the third impedance circuit 225c outputs the first transmit signal TX1 to the power amplifier 222. In contrast, in the low power mode of the first transmission mode, the third impedance circuit 225c outputs the first transmit signal TX1 to the first switch 223a. The third impedance circuit 225c may output the second transmit signal TX2 to the first switch 223a in the second transmission mode.

In addition, the third impedance circuit 225c may provide different impedances depending on the transmission mode. For example, the third impedance circuit 225c may provide different impedances in the high power mode and the low power mode of the first transmission mode. In addition, in the second transmission mode, the third impedance circuit 225c provides the same signal path as the low power mode. However, the first transmit signal TX1 may be output to the first switch 223a in the low power mode, but the second transmit signal TX2 may be output to the first switch 223a in the second transmission mode.

The power amplifier 222 may amplify and output the first transmit signal TX1 input in the high power mode of the first transmission mode. In contrast, the power amplifier 222 may be deactivated in the low power mode of the first transmission mode, as well as in and the second transmission mode. As described above, the first transmit signal TX1 may be a Wi-Fi transmit signal applied to a mobile terminal. In contrast, the second transmit signal TX2 may be a Bluetooth transmit signal.

The switch unit 223 may include the first switch 223a and the second switch 223b. The first switch 223a is turned off in the high power mode of the first transmission mode. In contrast, the first switch 223a is turned on in the low power mode of the first transmission mode and the second transmission mode. In the low power mode of the first transmission mode, the first switch 223a outputs the first transmit signal TX1 to the first node N1. Also, in the second transmission mode, the first switch 223a outputs the second transmit signal TX2 to the first node N1.

The second switch 223b provides a path between the second impedance circuit 225b and a ground in the high power mode of the first transmission mode. Accordingly, in the high power mode of the first transmission mode, an output impedance of the transmitter combo circuit 220 is set by the first impedance circuit 225a and the second impedance circuit 225b. In contrast, in the low power mode of the first transmission mode and the second transmission mode, the second switch 123b blocks a path between the second impedance circuit 225b and the ground. Accordingly, in the low power mode of the first transmission mode and the second transmission mode, the output impedance may be set by the first impedance circuit 225a and the third impedance circuit 225c.

A schematic structure of the transmitter combo circuit 220 of the inventive concept is described hereinabove. The transmitter combo circuit 220 of the inventive concept includes the power amplifier 222 activated only in the high power mode of the first transmission mode. The power amplifier 222 is deactivated in the low power mode of the first transmission mode and in the second transmission mode. The transmitter combo circuit 220 includes the switches 223a and 223b and the impedance circuit 225a, 225b, and 225c for providing an optimum signal path and an optimum output impedance according to each transmission mode. It may be possible to implement the transceiver combo chip 250 (refer to FIG. 8) capable of providing transmit signals of various standards with various output levels through the above-described configurations.

Figure 10A:
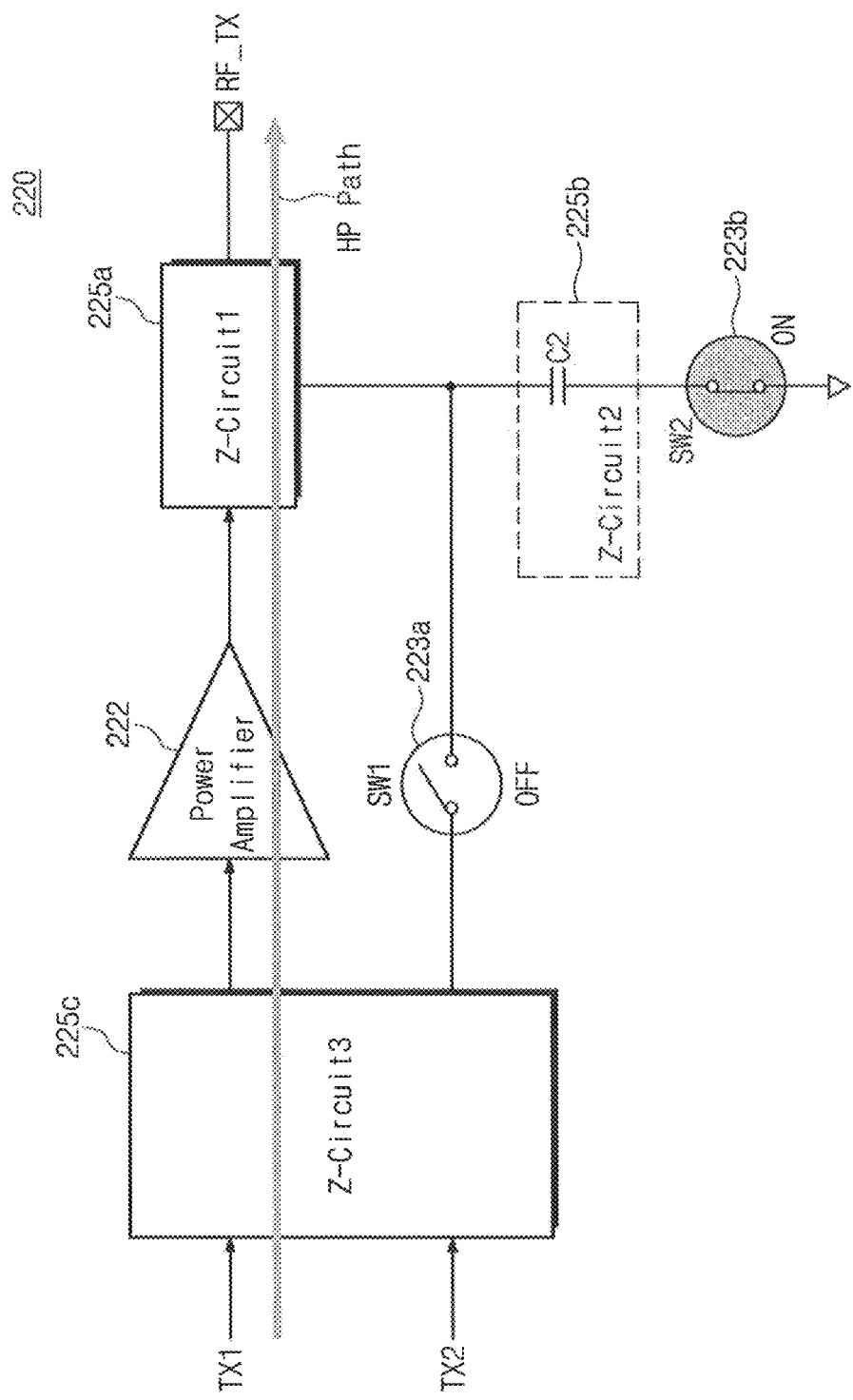
FIGS. 10A, 10B, and 10C are block diagrams illustrating a signal transmission path of the transmitter combo circuit of FIG. 9 in each transmission mode.
Figure 10B:
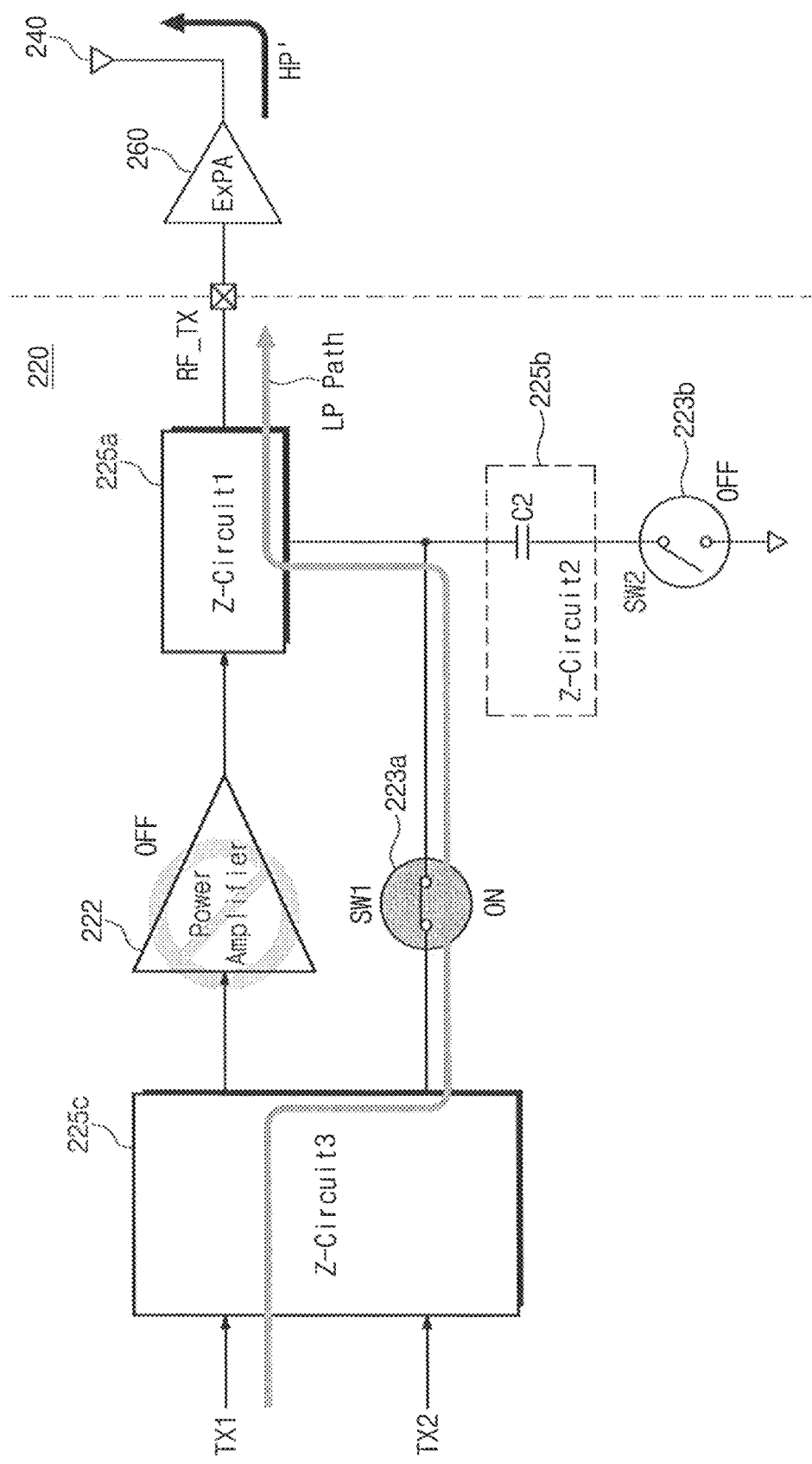
Figure 10C:
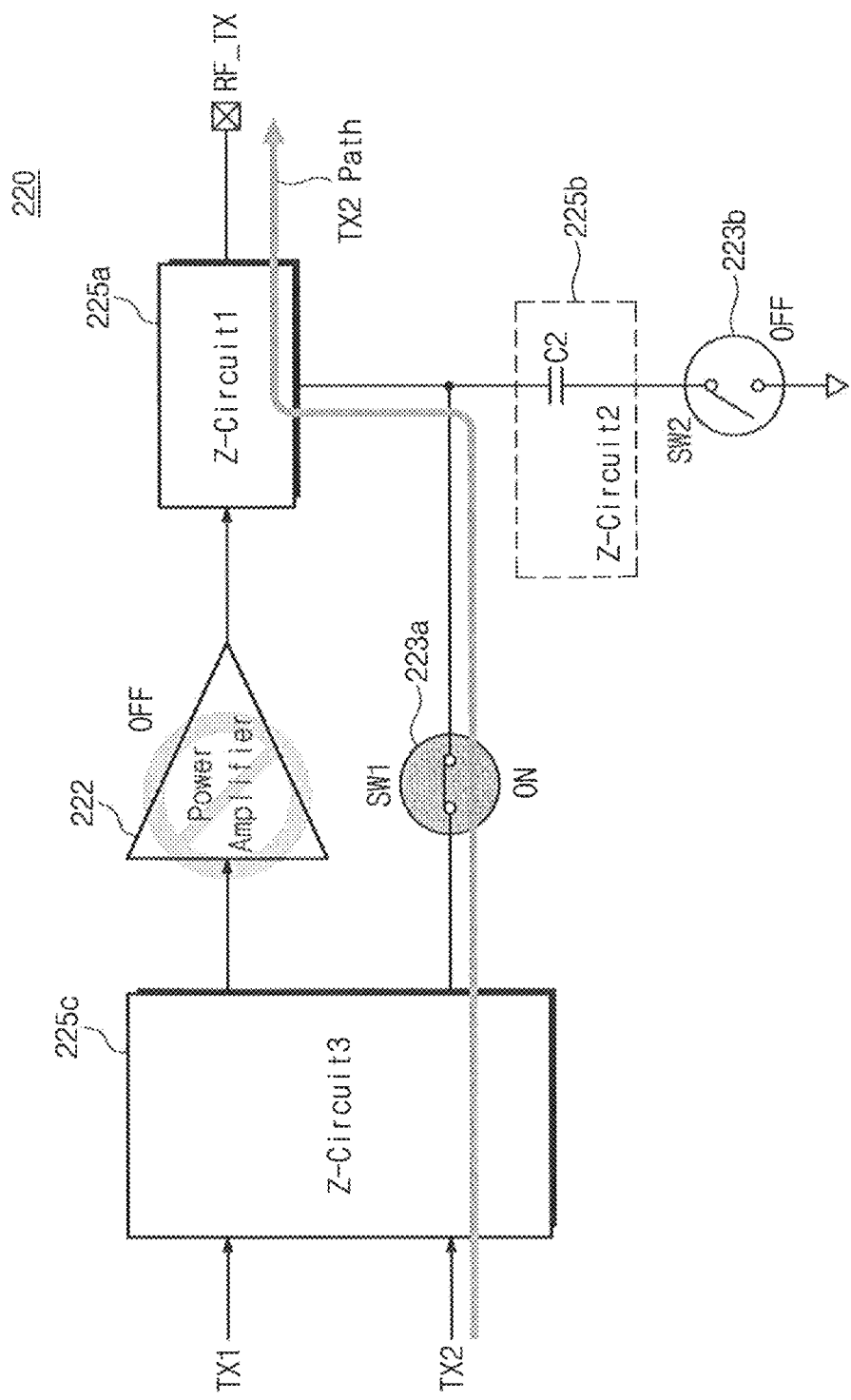

FIGS. 10A, 10B, and 10C are block diagrams illustrating a signal transmission path of a transmitter combo circuit of FIG. 9 in each transmission mode.

FIG. 10A illustrates a signal transmission path (e.g., an HP Path) showing states of the first switch 223a and the second switch 223b and a signal transmission path according to the states in the high power (HP) mode of the first transmission mode. Referring to FIG. 10A, in the high power mode of the first transmission mode, the third impedance circuit 225c selects the first transmit signal TX1 for output to the power amplifier 222. Since the first switch 223a is turned off (e.g., open) and the second switch 223b is turned on (e.g., closed), the second impedance circuit 225b is connected with a ground. The first transmit signal TX1 amplified by the power amplifier 222 is output to the radio frequency output port RF_TX through the first impedance circuit 225a. In the high power mode of the first transmission mode, an output impedance of the transmitter combo circuit 220 is set by the first impedance circuit 225a and the second impedance circuit 225b.

FIG. 10B illustrates a signal transmission path (e.g., an LP Path) showing states of the first switch 223a and the second switch 223b and a signal transmission path according to the states in the low power (LP) mode of the first transmission mode. Referring to FIG. 10B, in the low power mode of the first transmission mode, the third impedance circuit 225c selects the first transmit signal TX1 for output to the first switch 223a. In this case, the power amplifier 222 is deactivated. Also, the second switch 223b is turned off (e.g. open), and thus, the second impedance circuit 225b is disconnected from the ground. The first transmit signal TX1 is output to the radio frequency output port RF_TX through the first impedance circuit 225a by the first switch 223a. In the low power mode of the first transmission mode, an output impedance of the transmitter combo circuit 220 is set by the first and third impedance circuits 225a and 225c.

In the low power mode of the first transmission mode, the first transmit signal TX1_BB provided to the radio frequency output port RF_TX is amplified by the external power amplifier 260. The first transmit signal TX1 amplified by the external power amplifier 260 may be provided to the antenna 240.

FIG. 10C illustrates a signal transmission path (e.g., an LP Path) showing states of the switches 223a and 223b and a signal transmission path according to the states in the second transmission mode. Referring to FIG. 10C, in the second transmission mode, the third impedance circuit 225c selects the second transmit signal TX2 for output to the first switch 223a. In this case, the power amplifier 222 is deactivated. Also, the second switch 223b is turned off, and thus, the second impedance circuit 225b is disconnected from the ground. The second transmit signal TX2 is output to the radio frequency output port RF_TX through the first impedance circuit 225a by the first switch 223a. In the second transmission mode, an output impedance of the transmitter combo circuit 220 is set by the first and third impedance circuits 225a and 225c.

Figure 11:
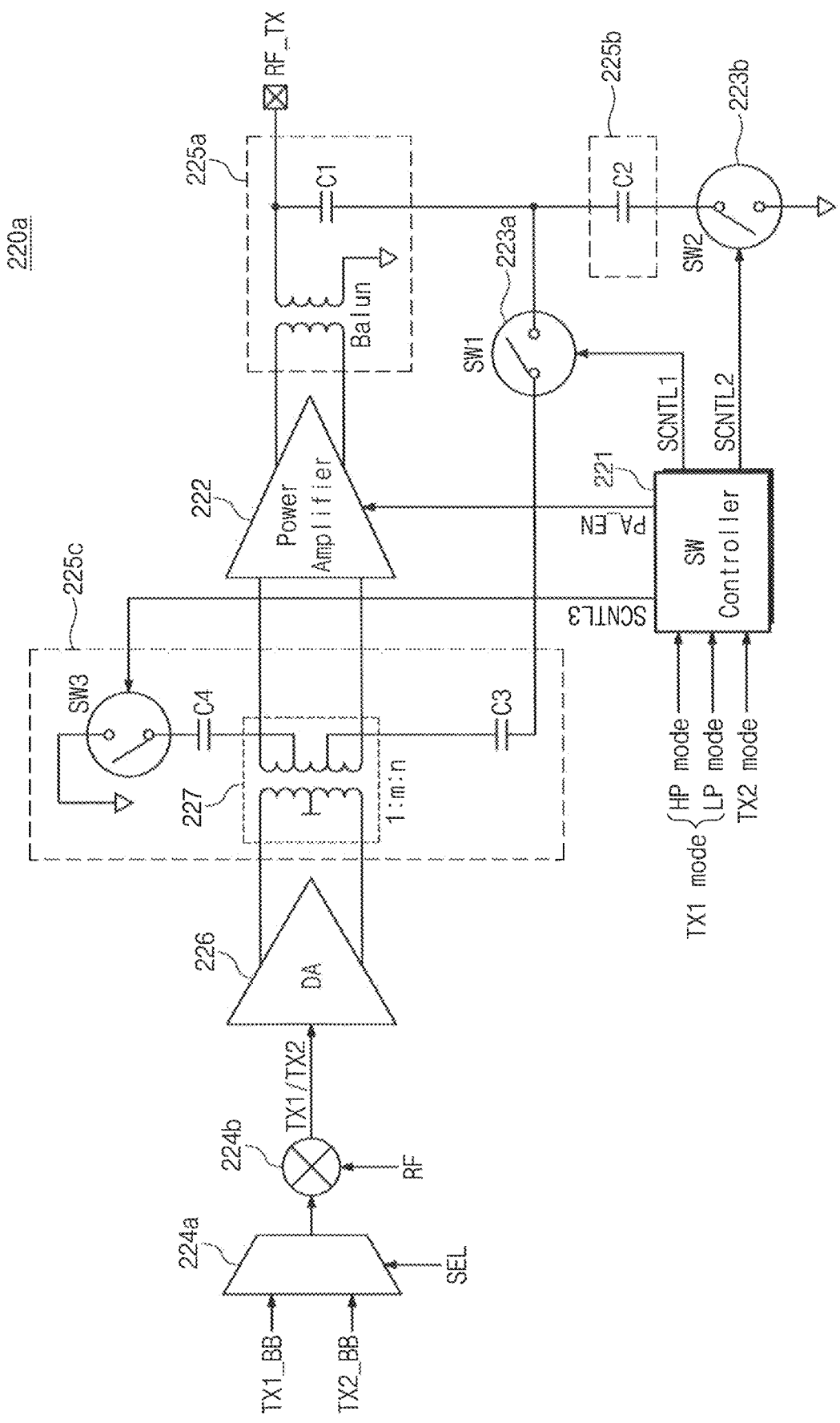
FIG. 11 is a block diagram illustrating an exemplary configuration of the transmitter combo circuit of FIG. 9.

FIG. 11 is a block diagram illustrating an exemplary configuration of a transmitter combo circuit of FIG. 9. Referring to FIG. 11, a transmitter combo circuit 220b may include, for example, a switch controller 221, the power amplifier 222, the first switch 223a, the second switch 223b, a mixer 224b, the first impedance circuit 225a, the second impedance circuit 225b, the third impedance circuit 225c, and a driving amplifier 226.

The switch controller 221 controls the power amplifier 222 and the first switch 223a and the second switch 223b depending on a transmission mode. In addition, the switch controller 221 connects a third switch SW3 included in the third impedance circuit 225c with a ground depending on the transmission mode. The switch controller 221 generates the amplifier enable signal PA_EN for activating the power amplifier 222 depending on the transmission mode. Also, the switch controller 221 generates the switch control signal SCNTL1 for controlling the first switch 223a and the switch control signal SCNTL2 for controlling the second switch 223b, depending on the transmission mode. Also, the switch controller 221 generates a switch control signal SCNTL3 for controlling the third switch SW3 included in the third impedance circuit 225c.

In the high power mode of the first transmission mode, the switch controller 221 activates the power amplifier 222, turns off the first switch 223a and the third switch SW3, and turns on the second switch 223b. In this case, the first transmit signal TX1 amplified by the driving amplifier 226 is transmitted to the power amplifier 222 through a balun 227. The first transmit signal TX1 amplified by the power amplifier 222 is output to the radio frequency output port RF_TX through the first impedance circuit 225a. In the high power mode, an output impedance of the radio frequency output port RF_TX is set by the first and second impedance circuits 225a and 225b.

In the low power mode of the first transmission mode, the switch controller 221 deactivates the power amplifier 222 and turns on the first switch 223a and the third switch SW3. In this case, the switch controller 221 turns off the second switch 223b, and thus, a tap connection of the balun 227 is changed, for example, from 1:1 to 3:2. Accordingly, the first transmit signal TX1 induced by the balun 227 is output to the radio frequency output port RF_TX through the first switch 223a. In the low power mode, the first transmit signal TX1 is transmitted to the radio frequency output port RF_TX without amplification. Afterwards, the power of the first transmit signal TX1 is amplified by the external power amplifier ExPA.

In the second transmission mode, the switch controller 221 deactivates the power amplifier 222 and turns on the first switch 223a and the third switch SW3. In this case, the switch controller 221 turns off the second switch 223b. For example, in the second transmission mode, the switch controller 221 controls the switches SW1, SW2, and SW3 in the same manner as the in low power mode. However, the second transmission mode does not include a power amplification procedure of the external power amplifier ExPA.

FIG. 12 is a table illustrating states of an amplifier and switches in a transmission mode of a transmitter combo circuit of FIG. 11. Referring to FIG. 12, the driving amplifier (DA) 226 maintains a turn-on state regardless of a transmission mode. In contrast, states of the power amplifier (PA) 222 and the first to third switches 223a, 223b, and SW3 are changed according to the transmission mode.

In the high power mode of the first transmission mode, under control of the switch controller 221, the power amplifier 222 is turned on, and the first switch 223a and the third switch SW3 are turned off. The second switch 223b is turned on. In this case, the first transmit signal TX1 amplified by the driving amplifier 226 is transmitted to the power amplifier 222 through the balun 227. The first transmit signal TX1 amplified by the power amplifier 222 is output to the radio frequency output port RF_TX through the first impedance circuit 225a.

In the low power mode of the first transmission mode, under control of the switch controller 221, the power amplifier 222 is turned off, and the first switch 223a and the third switch SW3 are turned on. The second switch 223b is turned off. Accordingly, the first transmit signal TX1, the level of which is decreased by the balun 227, is output to the radio frequency output port RF_TX without passing through the power amplifier 222.

In the second transmission mode, under control of the switch controller 221, the power amplifier 222 is turned off, and the first switch 223a and the third switch SW3 are turned on. The second switch 223b is turned off. Accordingly, the second transmit signal TX2, the level of which is decreased by the balun 227, is output to the radio frequency output port RF_TX without passing through the power amplifier 222.

Figure 13:
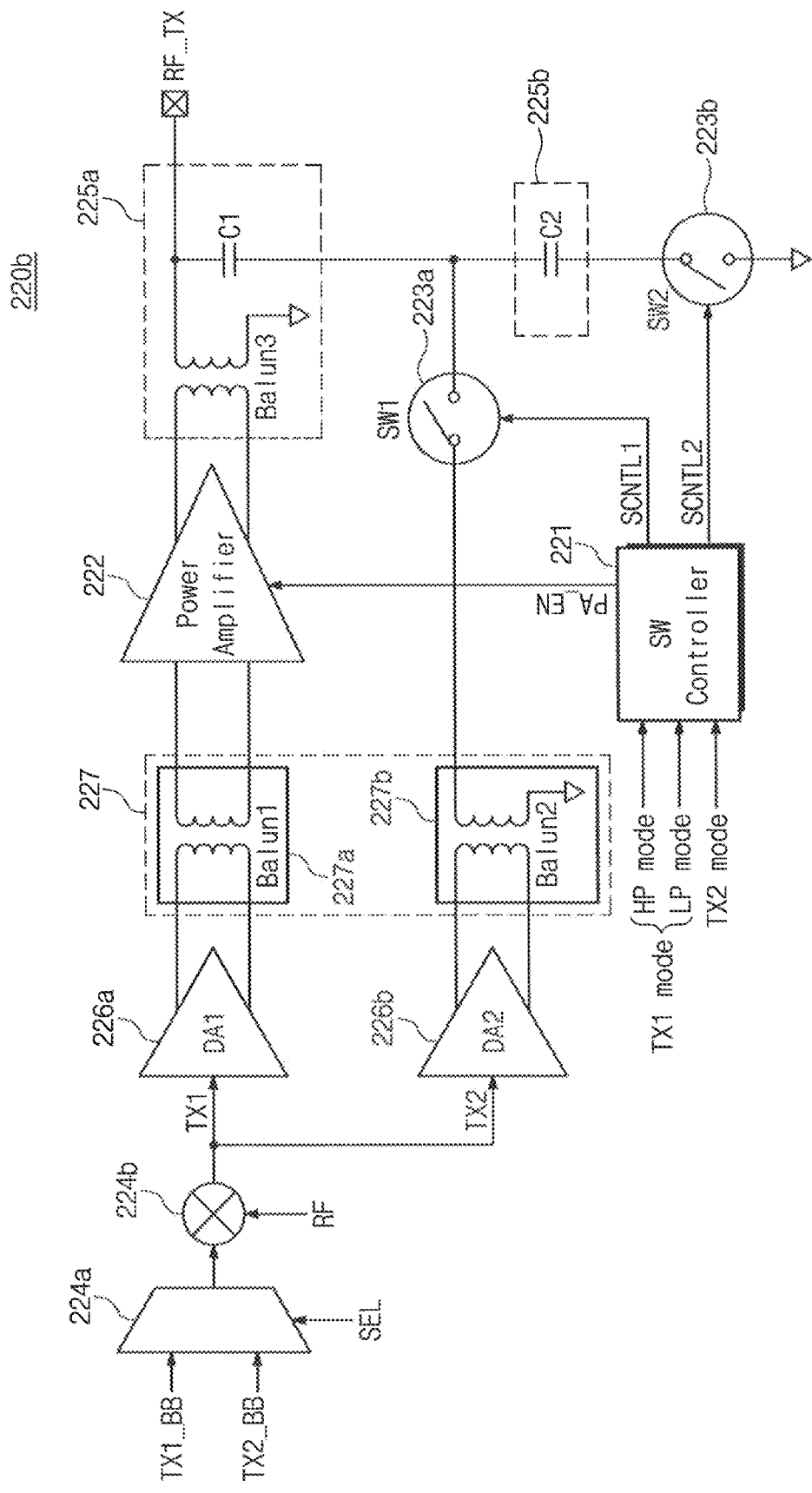
FIG. 13 is a block diagram illustrating another example of the transmitter combo of FIG. 9.

FIG. 13 is a block diagram illustrating another example of a transmitter combo circuit of FIG. 9. Referring to FIG. 13, a transmitter combo circuit 220b may include the switch controller 221, the power amplifier 222, the first switch 223a, the second switch 223b, a multiplexer 224a, the mixer 224b, the first impedance circuit 225a, the second impedance circuit 225b, the first driving amplifier 226a and the second driving amplifier 226b, and the first balun 227a and the second balun 227b. Here, operations of the multiplexer 224a and the mixer 224b are substantially the same as those of FIG. 11, and thus, a description thereof will not be repeated here.

The switch controller 221 controls the power amplifier 222 and the first switch 223 and the second switch 223b depending on the transmission mode. The switch controller 221 generates the amplifier enable signal PA_EN for activating the power amplifier 222 depending on the transmission mode. Also, the switch controller 221 generates the switch control signal SCNTL1 for controlling the first switch 223a and the switch control signal SCNTL2 for controlling the second switch 223b, depending on the transmission mode.

In the high power mode of the first transmission mode, the switch controller 221 activates the first driving amplifier 226a and the power amplifier 222. Additionally, it may be well understood that the switch controller 221 turns off the second driving amplifier 226b in the high power mode. For a brief description, control signals for controlling the first driving amplifier 226a and the second driving amplifier 226b are not illustrated in FIG. 13. In the high power mode, also, the switch controller 221 turns off the first switch 223a and turns on the second switch 223b. In this case, the first transmit signal TX1 amplified by the first driving amplifier 226a is transmitted to the power amplifier 222 through the first balun 227a. The first transmit signal TX1 amplified by the power amplifier 222 is output to the radio frequency output port RF_TX, the output impedance of which is formed by the first impedance circuit 225a and the second impedance circuit 225b.

In the low power mode of the first transmission mode, the switch controller 221 turns off the first driving amplifier 226a and the power amplifier 222 and turns on the second driving amplifier 226b and the first switch 223a. Also, the switch controller 221 turns off the second switch 223b. In this case, the first transmit signal TX1 may be provided to the radio frequency output port RF_TX through the second driving amplifier 226b and the first switch 223a. In the low power mode, the first transmit signal TX1 is transmitted to the radio frequency output port RF_TX without amplification. Afterwards, the power of the first transmit signal TX is amplified by the external power amplifier ExPA.

In the second transmission mode, the switch controller 221 turns off the first driving amplifier 226a and the power amplifier 222 and turns on the second driving amplifier 226b and the first switch 223a. Also, the switch controller 221 turns off the second switch 223b. In this case, the second transmit signal TX2 may be provided to the radio frequency output port RF_TX through the second driving amplifier 226b and the first switch 223a. However, the second transmission mode does not include a power amplification procedure of the external power amplifier ExPA. Here, an embodiment is described as the external power amplifier ExPA is not used in the second transmission mode. However, the inventive concept is not limited thereto. For example, the second transmit signal TX2 may be amplified by the external power amplifier ExPA even in the second transmission mode.

Figure 14:
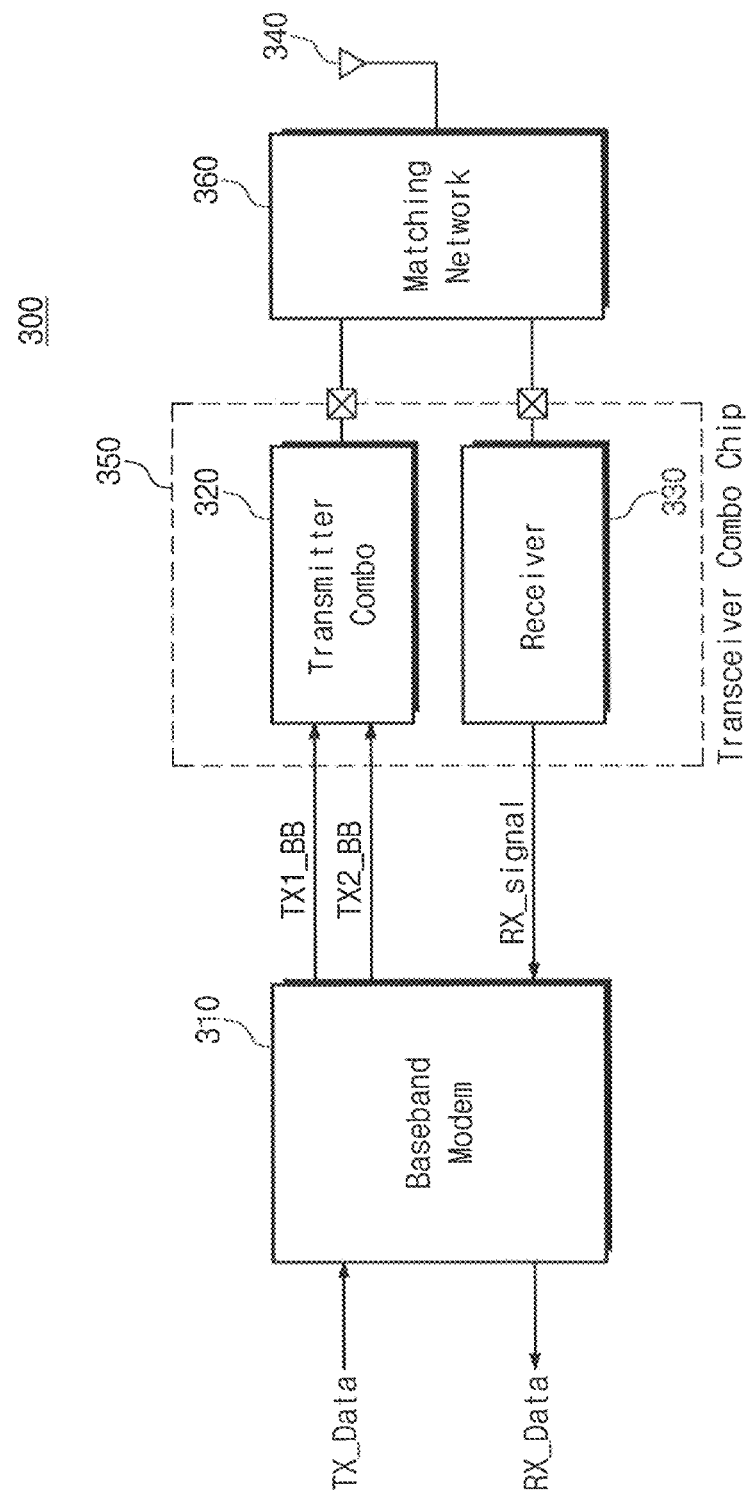
FIG. 14 is a block diagram illustrating another example of the wireless transceiver according to an embodiment of the inventive concept.

FIG. 14 is a block diagram illustrating another example of a wireless transceiver according to an embodiment of the inventive concept. Referring to FIG. 14, a wireless transceiver 300 may include a baseband modem 310, a transmitter combo circuit 320, a receiver 330, an antenna 340, and a matching network 360. The transmitter combo circuit 320 and the receiver 330 may constitute a transceiver combo chip 350 being a single integrated circuit chip. Here, the baseband modem 310, the transmitter combo circuit 320, the receiver 330, and the antenna 340 are substantially the same as those of FIG. 1, and thus, a description will not be repeated here.

The matching network 360 provides an impedance corresponding to each of a transmission mode and a reception mode between the transceiver combo chip 350 and the antenna 340. For example, when a transmit signal is transmitted through the antenna 340, the matching network 360 provides a matching impedance between the transmitter combo circuit 320 and the receiver 330, and the antenna 340. In addition, the matching network 360 provides a matching impedance between the antenna 340 and the receiver 330 upon receiving a wireless signal through the antenna 340.

Figure 15:
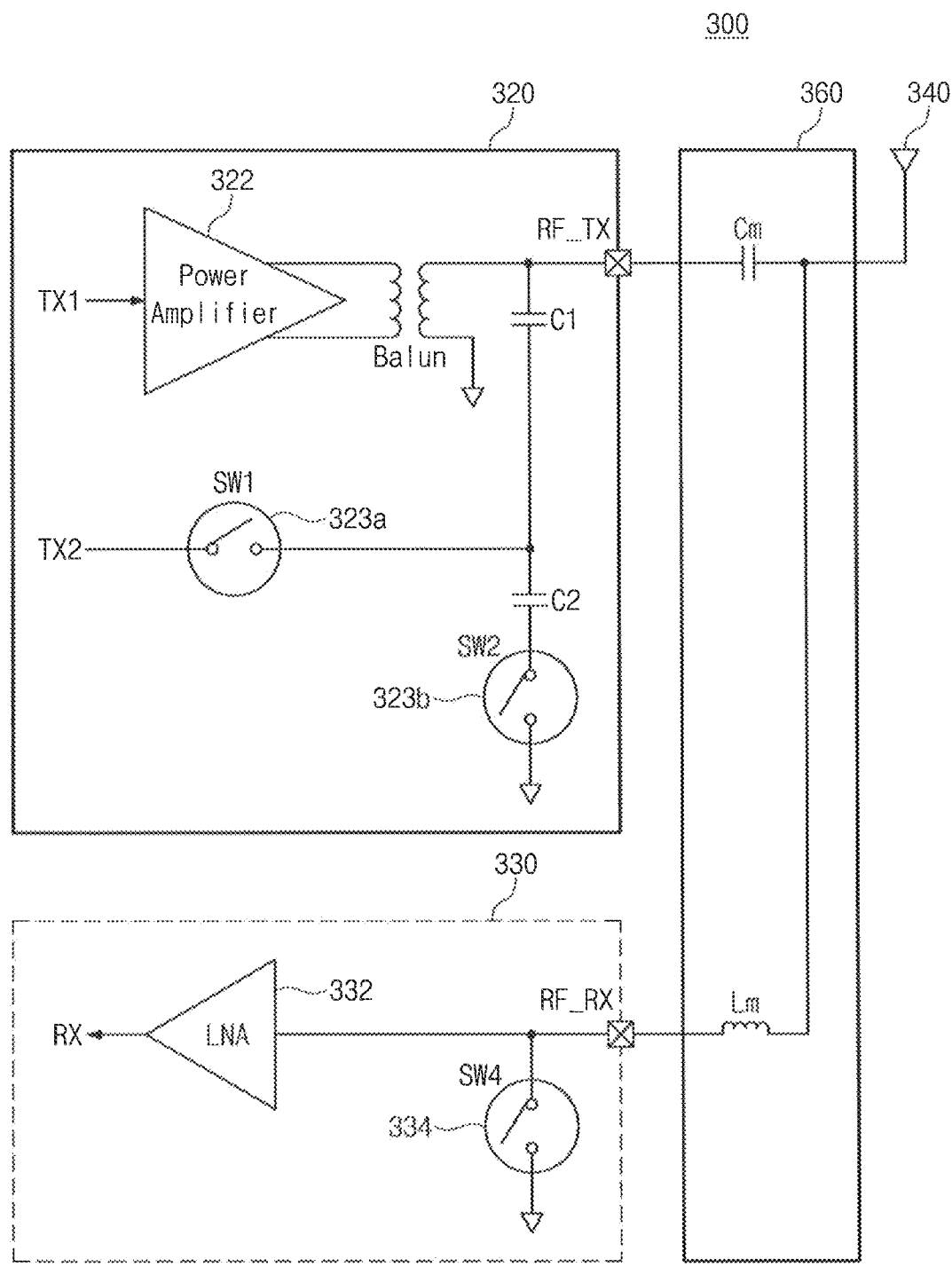
FIG. 15 is a circuit diagram illustrating the wireless transceiver of FIG. 14 in more detail.

FIG. 15 is a circuit diagram illustrating a wireless transceiver of FIG. 14 in more detail. Referring to FIG. 15, the wireless transceiver 300 may include the transmitter combo circuit 320, the receiver 330, the antenna 340, and the matching network 360. The transmitter combo circuit 320 is the same as the transmitter combo circuit 120 illustrated in FIG. 3.

To transmit the first transmit signal TX1 in the enabled state of the first transmission mode TX1_EN, a first switch 323a of the transmitter combo circuit 320 is turned off, and a second switch 323b thereof is turned on. In addition, a switch (SW4) 334 of the receiver 330 is turned on in the enabled state of the first transmission mode TX1_EN, and thus, an input of the receiver 330 is connected to a ground. In the above-described condition, the impedance of the antenna 340 is set by capacitors C1, C2, and Cm and an inductor Lm.

To transmit the second transmit signal TX2 in the enabled state of the second transmission mode TX2_EN, the first switch 323a of the transmitter combo circuit 320 is turned on, and the second switch 323b thereof is turned off. In addition, the switch 334 of the receiver 330 is turned on in the enabled state of the second transmission mode TX2_EN, and thus, the input of the receiver 330 is connected to the ground. In the above-described condition, the impedance of the antenna 340 is set by capacitors C1 and Cm and the inductor Lm.

In the reception mode, the first switch 323a of the transmitter combo circuit 320 is turned off, and the second switch 323b thereof is turned on. Also, the switch 334 of the receiver 330 is turned off, and thus, the input of the receiver 330 is disconnected from the ground. In this case, a wireless signal received from the antenna 340 may be provided to a low noise amplifier (LNA) 332. In the above-described condition, an impedance seen from a wireless signal input port RF_RX of the receiver 330 is set by capacitors C1, C2, and Cm and the inductor Lm.

A matching impedance may be optimized in each of the transmission mode and the reception mode by adjusting the sizes of the capacitor Cm and the inductor Lm included in the matching network 360.

Figure 16:
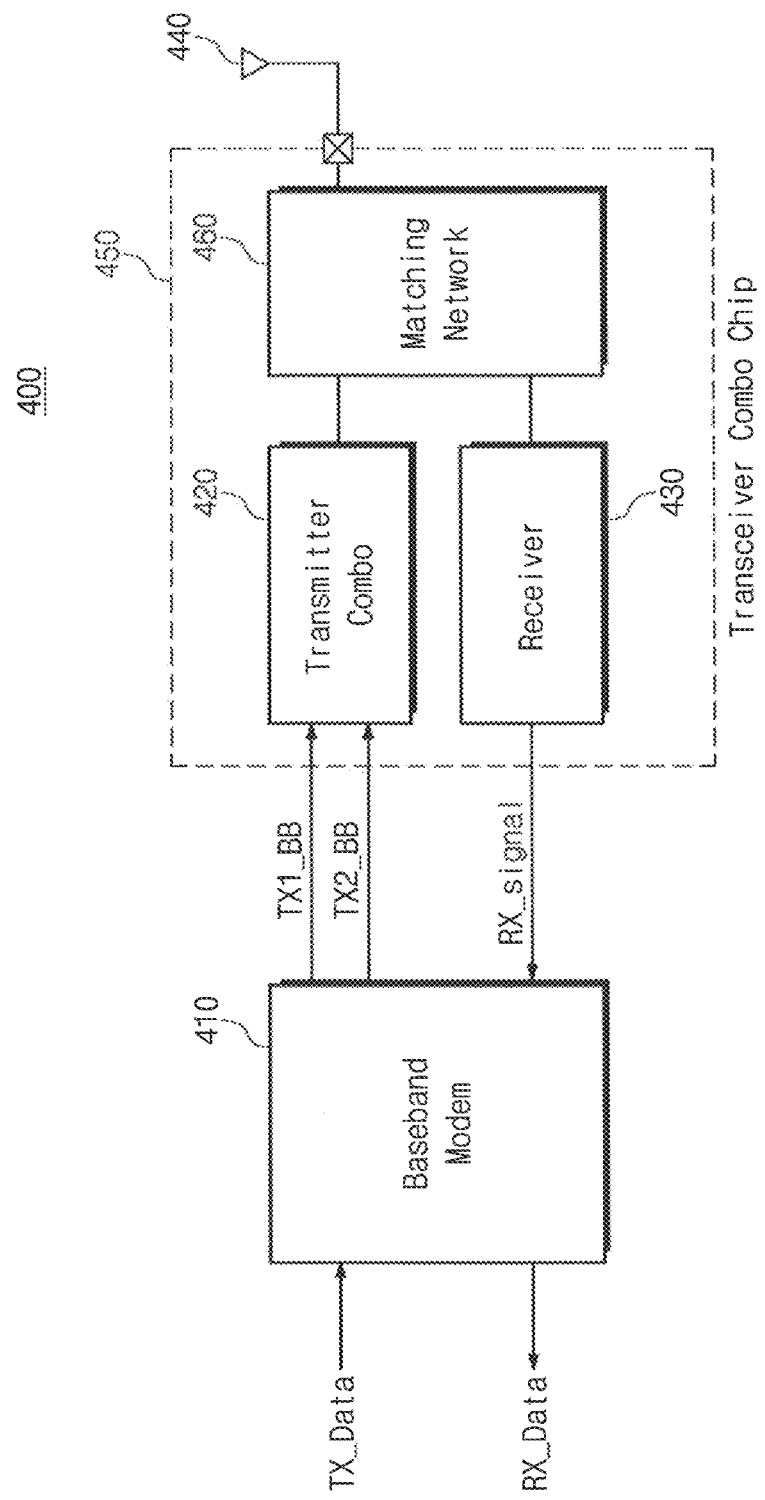
FIG. 16 is a block diagram illustrating another example of the wireless transceiver according to an embodiment of the inventive concept.

FIG. 16 is a block diagram illustrating another example of a wireless transceiver according to an embodiment of the inventive concept. Referring to FIG. 16, a wireless transceiver 400 may include a baseband modem 410, a transmitter combo circuit 420, a receiver 430, an antenna 440, and a matching network 460. Here, the transmitter combo circuit 420, the receiver 430, and the matching network 460 may constitute a transceiver combo chip 450 being a single integrated circuit chip. The matching network 460 may be embedded in the transceiver combo chip 450 and may have the same function as the matching network 360 of FIG. 15.

Figure 17:
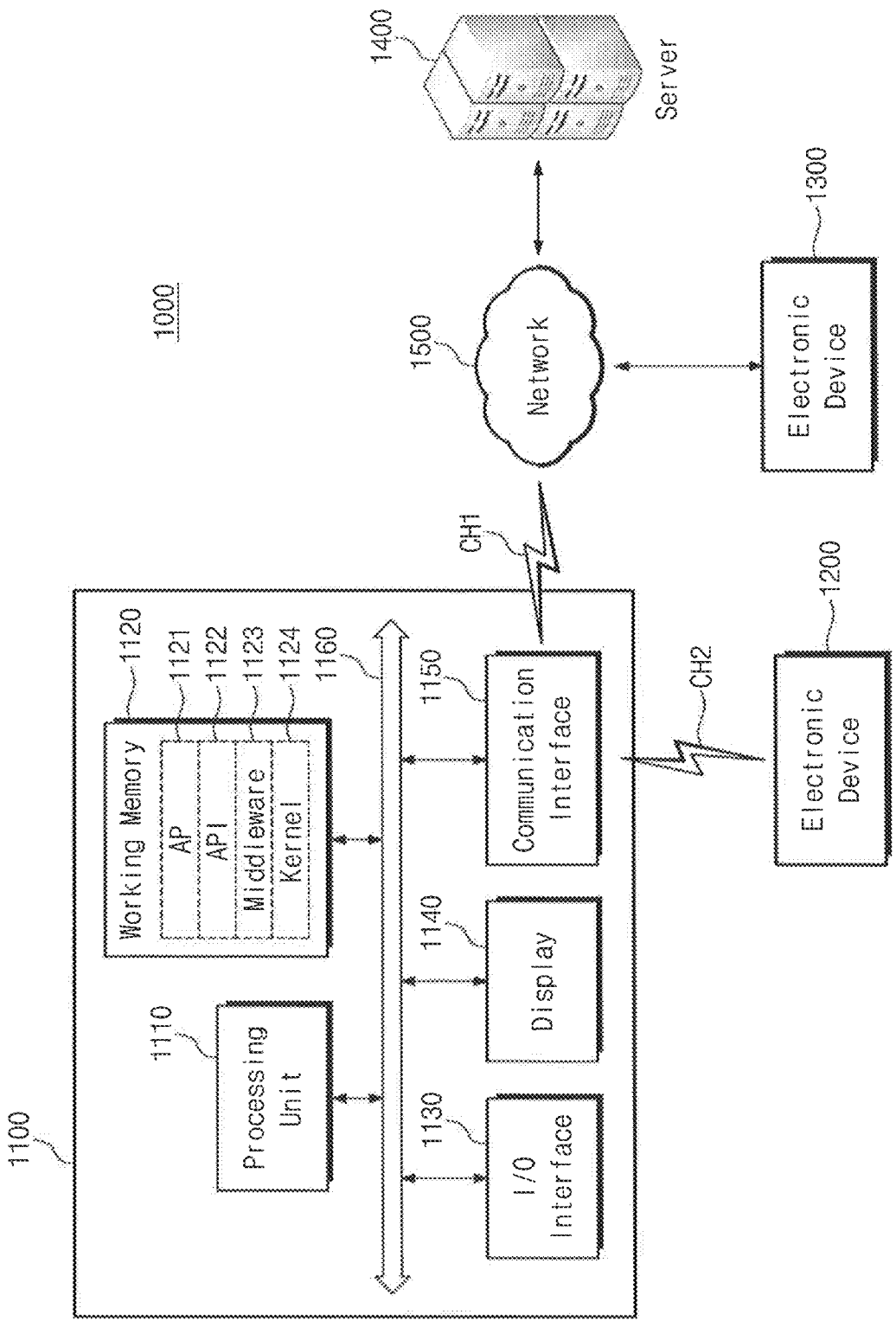
FIG. 17 is a block diagram illustrating an electronic device according to an embodiment of the inventive concept.

FIG. 17 is a block diagram illustrating an electronic device according to an embodiment of the inventive concept. Referring to FIG. 17, an electronic device 1100 may include a processing unit 1110, a working memory 1120, an input/output interface 1130, a display 1140, a communication interface 1150, and a bus 1160.

The bus 1160 electrically connects the processing unit 1110, the working memory 1120, the input/output interface 1130, the display 1140, and the communication interface 1150. The bus 1160 may be a system bus for providing a network in the interior of the electronic device 1100. The bus 1160 may include, for example, a data bus, an address bus, and a control bus. The data bus is a path through which data move. The data bus may be mainly provided as a path for accessing a working memory (not illustrated) or a storage device (not illustrated). The address bus provides an address exchange path between intellectual properties (IPs). The control bus provides a path through which control signals are transmitted between the intellectual properties (IPs). However, a configuration of the bus 1160 is not limited to the above description, and the bus 1160 may further include various arbiters for efficient management.

The processing unit 1110 may receive and parse, for example, instructions from any other components (e.g., the working memory 1120, the input/output interface 1130, the display 1140, and the communication interface 1150) and may execute calculation or data processing depending on the parsed instructions.

With continued reference to FIG. 17, the working memory 1120 may store, for example, instructions or data that are received from any other components (e.g., the processing unit 1110, the input/output interface 1130, the display 1140, and the communication interface 1150) or are generated thereby. For example, the working memory 1120 may include programming modules such as a kernel 1124, a middleware 1123, an application programming interface (API) 1122, and an application (AP) 1121. Each of the above-described programming modules may include a combination of at least two of software, firmware, or hardware.

The kernel 1124 may control or manage system resources (e.g., the bus 1160, the processing unit 1110, and the working memory 1120) that are available upon executing operations or functions implemented in other programming modules such as the middleware 1123, the API 1122, and the application 1121. Also, the kernel 1124 may provide an interface that allows the middleware 1123, the API 1122, or the application 1121 to access discrete components of the electronic device 1100.

The middleware 1123 may be a medium that allows the kernel 1124 to transmit and receive data through communication with the AP 1122 or the application 1121. Also, the middleware 1123 may control task requests (e.g., scheduling or load balancing) by allocating priorities for using system resources of the electronic device 1100 to the application 1121, by one or more applications (e.g., 1121).

The API 1122 refers to an interface that allows the application 1121 to control functions that the kernel 1124, or the middleware 1123, provides. For example, the API 1122 may include at least one interface or function (e.g., a command) for a file control, a window control, video processing, or a character control.

According to various embodiments of the inventive concept, the application 1121 may include, for example, an SMS/MMS application, an e-mail application, a calendar application, an alarm application, a healthcare application (e.g., an application for measuring an exercise quantity or a level of blood sugar), or an environmental information application (e.g., an application for providing information of barometric pressure, humidity, or temperature). Also, the application 1121 may be an application associated with information exchange between the electronic device 1100 and any other electronic device 1200. The application associated with information exchange may include, for example, a notification relay application capable of providing a given type of information to a paired electronic device, or a device management application capable of managing the paired electronic device. For example, the notification relay application may include a function of transmitting a notification, which is generated by other applications (e.g., applications for SMS/MMS, e-mail, health care, or environmental information) in the electronic device 1100, to the paired electronic device 1200. Additionally or alternatively, the notification relay application may receive, for example, a notification from the paired electronic device 1200 and may provide the received notification information to a user. For example, the device management application may manage activating or deactivating functions of at least a part of the paired electronic device 1200 communicating with the electronic device 1100 or may control display brightness (or resolution) of the paired electronic device 1200 or an application operated by the paired electronic device 1200 or a service (e.g., a voice call service or a messaging service) provided thereby.

The input/output interface 1130 may receive, for example, an instruction or data from the user and may provide the received instruction or data to the processing unit 1110, the working memory 1120, or the communication interface 1150 through the bus 1160. For example, the input/output interface 1130 may provide the processing unit 1110 with data associated with a touch of the user input through a touchscreen. Also, the input/output interface 1130 may output, for example, instructions or data received from the processing unit 1110, the working memory 1120, or the communication interface 1150 through the bus 1160. For example, the input/output interface 1130 may output voice data processed through the processing unit 1110 to the user through a speaker.

The display 1140 may display various types of information (e.g., multimedia or text data) to the user. It may be well understood that the display 1140 is provided in combination with the input/output interface 1130 of a touchpad form.

The communication interface 1150 may establish communication between the electronic device 1200 and at least one paired electronic device (e.g., an electronic device 1300 or a server 1400). For example, the communication interface 1150 may be connected to a network 1500 through wireless communications or wired communications, thus communicating with a paired electronic device. The wireless communications may include at least one of, for example, Bluetooth, near field communication (NFC), global positioning system (GPS), or cellular communications (e.g., LTE, LTE-A, CDMA, WDCMA, UMTS, WiBro, or GSM). The wired communications may include at least one of, for example, a universal serial bus (USB), a high definition multimedia interface (HDMI), recommended standard 232 (RS-232), or a plain old telephone service (POTS).

According to various embodiments of the inventive concept, the network 1500 may be a wireless local area network (WLAN). The network 1500 may include at least one of, for example, a computer network, an Internet, an Internet of things, or a telephone network. The communication interface 1150 may communicate with the network 1500 in compliance with the first wireless communication standard (e.g., Wi-Fi) and may communicate with the electronic device 1200 in compliance with the second wireless communication standard (e.g., Bluetooth). In this case, the communication interface 1150 may transmit signals of different standards by using a transceiver combo chip described with reference to FIGS. 1 to 16.

Figure 18:
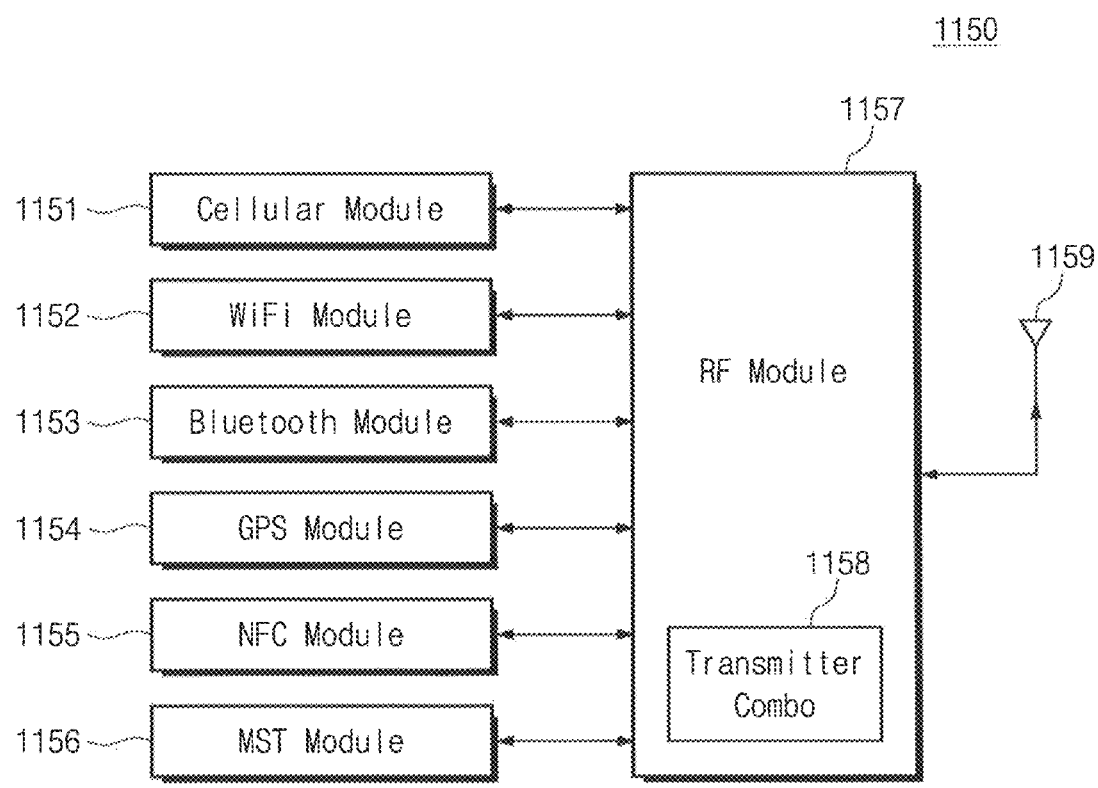
FIG. 18 is a view illustrating a configuration of a communication interface of FIG. 17.

FIG. 18 is a view illustrating a configuration of a communication interface of FIG. 17. Referring to FIG. 18, the communication interface 1150 may include a plurality of communication modules 1151 to 1156, a radio frequency (RF) module 1157, and an antenna 1159. The plurality of communication modules 1151 to 1156 may include, for example, a cellular module 1151, a Wi-Fi module 1152, a Bluetooth module 1153, a GPS module 1154, an NFC module 1155, and a magnetic secure transmission (MST) module 1156.

The cellular module 1151 may provide, for example, a voice call, a video call, a character service, or an Internet service through a communication network. According to an embodiment of the inventive concept, the cellular module 1151 may identify and authenticate another electronic device 1300 within the network 1500 (refer to FIG. 17) by using a subscriber identification module (e.g., a SIM card).

The RF module 1157 may include a transmitter combo circuit 1158. Although not illustrated in FIG. 18, the RF module 1157 may further include a frequency filter, a low noise amplifier (LNA), etc. The transmitter combo circuit 1158 may provide the antenna 1159 with a wireless transmit signal from at least two of the cellular module 1151, the Wi-Fi module 1152, the Bluetooth module 1153, or the NFC module 1155. To this end, the transmitter combo circuit 1158 may include a switch unit and an impedance unit. The functions and configuration of the transmitter combo circuit 1158 may include functions and configurations described with reference to FIGS. 2 and 9.

As described above, according to the inventive concept, it may be possible to integrate transmitters of different wireless communication standards, a switch for changing a transmission mode, and components for impedance matching in a single chip. Accordingly, a transmitter combo circuit supporting a plurality of communication standards may be implemented with low costs.

While the inventive concept has been described with reference to embodiments, it will be apparent to those skilled in the art that various changes and modifications may be made without departing from the spirit and scope of the inventive concept. Therefore, it should be understood that the above embodiments are not limiting, but illustrative.

What is claimed is:

1. A transmitter device configured to receive a first signal from a first base band modem at a first input port and to receive a second signal from a second baseband modem at a second input port comprising:
    an output port connected to an antenna;
    a first impedance circuit configured to transfer the first signal to the output port in a first mode, and configured to transfer the second signal to the output port in a second mode;
    a second impedance circuit connected to the first impedance circuit;
    a first switch configured to selectively connect the second input port to the first impedance circuit; and
    a second switch configured to selectively connect the second impedance circuit to a ground,
    wherein, in the first mode, the second input port is disconnected from the first impedance circuit, and the second impedance circuit is connected to the ground; and
    wherein, in the second mode, the second input port is connected to the first impedance circuit, and the second impedance circuit is disconnected from the ground.

2. The transmitter device of claim 1, wherein the first signal and the second signal are of different wireless communication standards.

3. The transmitter device of claim 1, further comprising:
    a power amplifier configured to amplify the first signal to transmit the amplified first signal to the first impedance circuit in the first mode.

4. The transmitter device of claim 1, further comprising:
    a power amplifier connected to the output port and configured to selectively amplify a third signal from the output port to transmit the amplified third signal to the antenna.

5. The transmitter device of claim 3, wherein the first impedance circuit includes:
    a balun configured to convert a balanced output of the power amplifier to an unbalanced output and to provide the unbalanced output to the output port as the first signal; and
    a first capacitor configured to connect the output port and the second impedance circuit.

6. The transmitter device of claim 5, wherein the second impedance circuit includes a second capacitor configured to provide a capacitive impedance, and
    wherein the second signal is provided to a node between the first capacitor and the second capacitor in the second transmission mode.

7. The transmitter device of claim 1, further comprising:
    a switch controller configured to control the first switch, and the second switch in each of the first mode and the second mode.

8. The transmitter device of claim 7, wherein, in the first mode, the switch controller turns off the first switch and turns on the second switch, and
    wherein, in the second mode, the switch controller turns on the first switch and turns off the second switch.

9. The transmitter device of claim 8, further comprising:
    a power amplifier configured to amplify the first signal to transmit the amplified first signal to the first impedance circuit in the first mode, wherein the switch controller turns on the power amplifier in the first mode and turns off the power amplifier in the second mode.

10. The transmitter device of claim 9, wherein the power amplifier, the first impedance circuit, the second impedance circuit, and a switch unit including the first switch and the second switch, are integrated into a single chip.

11. A transmitter device comprising:
a first impedance circuit configured to receive a first signal from a first baseband modem and a second signal from a second baseband modem, and configured to output the first signal through a first port in a first mode, to output the second signal through a second port in a second mode, and to output the first signal through the second port in a third mode;
an output port connected to an antenna;
a second impedance circuit configured to transfer the first signal to the output port in the first mode and in the third mode, and to transfer the second signal to the output port in the second mode;
a third impedance circuit connected to the second impedance circuit;
a first switch configured to selectively connect the second port to the first impedance circuit; and
a second switch configured to selectively connect the second impedance circuit to a ground,
wherein, in the first mode, the second port is disconnected from the second impedance circuit, and the third impedance circuit is connected to the ground; and
wherein, in the second mode and in the third mode, the second port is connected to the second impedance circuit, and the third impedance circuit is disconnected from the ground.

12. The transmitter device of claim 11, wherein the first signal and the second signal are of different wireless communication standards.

13. The transmitter device of claim 11, further comprising:
a power amplifier configured to amplify the first signal to transmit the amplified first signal to the second impedance circuit in the first mode.

14. The transmitter device of claim 13, wherein the second impedance circuit includes:
a first balun configured to convert a balanced output of the power amplifier to an unbalanced output and to provide the unbalanced output to the output port; and
a first capacitor configured to electrically connect the output port and the third impedance circuit.

15. The transmitter device of claim 14, wherein the second impedance circuit and the third impedance circuit are connected in series between the output port and the ground in the first mode.

16. The transmitter device of claim 13, further comprising:
a driving amplifier configured to amplify the first signal from the first baseband modem or the second signal from the second baseband modem, and to provide the amplified one of the first signal or the second signal to the first impedance circuit.

17. The transmitter device of claim 16, wherein the first impedance circuit includes:
a balun configured to provide the first signal output from the driving amplifier to a balanced input terminal of the power amplifier in the first mode and to provide the first signal or the second signal output from the driving amplifier to the first switch in the second mode or the third mode.

18. The transmitter device of claim 17, wherein the first impedance circuit further includes:
a third switch configured to connect an output port of a second balun to a ground for conversion to an unbalanced port.

19. The transmitter device of claim 11, further comprising:
a first driving amplifier configured to selectively amplify and transmit the first signal to the second impedance circuit; and
a second driving amplifier configured to selectively amplify and transmit the second signal to the first switch.

20. The transmitter device of claim 11, wherein the first impedance circuit, the second impedance circuit, the third impedance circuit, the first switch and the second switch are formed in a single chip, and further comprising:
an external power amplifier configured to amplify a third signal from the output port, and configured to transfer the amplified third signal to the antenna.

\* \* \* \* \*